United States Patent
Sakata et al.

(10) Patent No.: US 10,192,920 B2
(45) Date of Patent: Jan. 29, 2019

(54) SOLID-STATE IMAGING DEVICE

(71) Applicant: PANASONIC INTELLECTUAL PROPERTY MANAGEMENT CO., LTD., Osaka (JP)

(72) Inventors: Yusuke Sakata, Osaka (JP); Manabu Usuda, Hyogo (JP); Mitsuyoshi Mori, Kyoto (JP); Yoshihisa Kato, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/913,106

(22) Filed: Mar. 6, 2018

(65) Prior Publication Data
US 2018/0197905 A1 Jul. 12, 2018

Related U.S. Application Data

(63) Continuation of application No. PCT/JP2016/004058, filed on Sep. 6, 2016.
(Continued)

(51) Int. Cl.
*H01L 31/107* (2006.01)
*H01L 27/146* (2006.01)
(Continued)

(52) U.S. Cl.
CPC ...... *H01L 27/1463* (2013.01); *H01L 27/1464* (2013.01); *H01L 27/14612* (2013.01);
(Continued)

(58) Field of Classification Search
CPC .................. H01L 31/02016; H01L 31/0248
See application file for complete search history.

(56) References Cited

U.S. PATENT DOCUMENTS

2009/0121306 A1 5/2009 Ishikawa
2009/0256223 A1 10/2009 Yamamura et al.
(Continued)

FOREIGN PATENT DOCUMENTS

JP    2015-005752 A    1/2015
WO    2006/068184 A1   6/2006
(Continued)

OTHER PUBLICATIONS

International Search Report dated Nov. 8, 2016, issued in International Patent Application No. PCT/JP2016/004058; with English translation.
(Continued)

*Primary Examiner* — Cheung Lee
(74) *Attorney, Agent, or Firm* — McDermott Will & Emery LLP

(57) ABSTRACT

A solid-state imaging device includes a substrate of P type and a wiring layer. The substrate includes: a first semiconductor region disposed on a first principle surface and extending in a direction from the first principal surface toward the second principal surface; a second semiconductor region disposed between the second principal surface and the first semiconductor region and connected to the first semiconductor region; a P type semiconductor region disposed between the second principal surface and the second semiconductor regions of two pixels; and a pixel isolation region disposed inside the substrate, between the first semiconductor regions of the two pixels. The second semiconductor region and the P type semiconductor region form an avalanche multiplication region.

10 Claims, 17 Drawing Sheets

Related U.S. Application Data

(60) Provisional application No. 62/216,238, filed on Sep. 9, 2015, provisional application No. 62/275,998, filed on Jan. 7, 2016.

(51) Int. Cl.
| | | |
|---|---|---|
| *H01L 31/00* | (2006.01) | |
| *H04N 5/369* | (2011.01) | |
| *H04N 5/374* | (2011.01) | |
| *H04N 5/378* | (2011.01) | |

(52) U.S. Cl.
CPC ........ *H01L 27/14643* (2013.01); *H01L 31/00* (2013.01); *H01L 31/107* (2013.01); *H01L 31/1075* (2013.01); *H04N 5/369* (2013.01); *H04N 5/374* (2013.01); *H04N 5/378* (2013.01)

(56) References Cited

U.S. PATENT DOCUMENTS

| | | |
|---|---|---|
| 2014/0374867 A1 | 12/2014 | De Munck et al. |
| 2015/0281620 A1 | 10/2015 | Usuda et al. |

FOREIGN PATENT DOCUMENTS

| | | |
|---|---|---|
| WO | 2008/004547 A1 | 1/2008 |
| WO | 2014/097519 A1 | 6/2014 |

OTHER PUBLICATIONS

Written Opinion of the International Searching Authority dated Nov. 8, 2016, issued in International Patent Application No. PCT/JP2016/004058; with English translation.

SOLID-STATE IMAGING DEVICE

CROSS REFERENCE TO RELATED APPLICATIONS

This application is a U.S. continuation application of PCT International Patent Application Number PCT/JP2016/004058 filed on Sep. 6, 2016, claiming the benefit of priority of U.S. Provisional Patent Application No. 62/216,238 filed on Sep. 9, 2015 and U.S. Provisional Patent Application No. 62/275,998 filed on Jan. 7, 2016, the entire contents of which are hereby incorporated by reference.

BACKGROUND

1. Technical Field

The present disclosure relates to a solid-state imaging device, and particularly relates to a solid-state imaging device which detects weak light.

2. Description of the Related Art

In recent years, high sensitivity cameras are used in various fields such as medicine, biotechnology, chemistry, surveillance, in-vehicle, radiation detection, and so on. Avalanche photodiodes (hereinafter, also referred to as APDs) have been used as one of the ways to improve the sensitivity of cameras. APDs are photodiiodes having light detection sensitivity that has been improved by multiplying, using avalanche breakdown, the signal charge generated by photoelectric conversion. A photon counting photodetector (International publication No. WO2008/004547) and a high sensitivity image sensor (International publication No. WO2014/097519 and Japanese Unexamined Patent Application Publication No. 2015-5752) that can detect even a few photons by using APDs have been conceived so far.

SUMMARY

In order to form an APD in a semiconductor substrate, a region of a high electric field needs to be formed in the substrate. Accordingly, in International publication No. WO2008/004547, a high voltage is applied between the front surface and the back surface of the substrate to cause the avalanche breakdown to realize a photodetector capable of detecting photons. In order to apply such a structure to a solid-state imaging device, a pixel circuit to which a high voltage is not applied needs to be formed separately from the APD to which a high voltage is applied. However, light cannot be detected in a region in which a pixel circuit is disposed, and decline in the sensitivity due to a reduced aperture ratio has been a problem. In view of the above, in order to achieve a high aperture ratio, as described in International publication No. WO2014/097519, a technique in which an APD and a pixel circuit are formed on different substrates, and bonded together has been proposed. However, since it is difficult to achieve miniaturization with this technique, there is a problem that it is difficult to obtain a high resolution.

In Japanese Unexamined Patent Application Publication No. 2015-5752, an APD is formed in the same substrate as a CMOS pixel circuit. As described in paragraph 0044 of Japanese Unexamined Patent Application Publication No. 2015-5752, in order to apply a bias to the second doped region and the third doped region independently from each other, the first doped region or fourth doped region is used to isolate the second doped region from the third doped region. However, in this structure, signal charge easily leaks to an adjacent pixel and crosstalk occurs. In particular, assuming a case where a high-intensity subject appears in a screen, excessive signal charge leaks from the pixel in which signal charge is saturated and the leaked signal charge saturates an adjacent pixel one after another, the crosstalk at the time of saturation also becomes a problem.

The present disclosure has an object to provide a solid-state imaging device in which an avalanche photodiode and a pixel circuit are disposed in the same semiconductor substrate while satisfying a high aperture ratio, and which is easily miniaturized and reduces crosstalk.

In order to achieve the above object, a solid-state imaging device according to one aspect of the present disclosure includes: a pixel array including a first pixel and a second pixel which is adjacent to the first pixel. The pixel array includes: a substrate of a first conductivity type, the substrate having a first principal surface and a second principal surface which is on a reverse side of the first principal surface and where light enters; and a wiring layer disposed on the first principal surface. The substrate includes: a first semiconductor region of a second conductivity type which is different from the first conductivity type, the first semiconductor region being provided for each of the first pixel and the second pixel, disposed inside the substrate, and extending in a direction from the first principal surface toward the second principal surface; a second semiconductor region of the second conductivity type provided for each of the first pixel and the second pixel, the second semiconductor region being disposed inside the substrate, between the second principal surface and the first semiconductor region, and connected to the first semiconductor region; a third semiconductor region of the first conductivity type, the third semiconductor region being disposed inside the substrate, between (i) the second principal surface and (ii) the second semiconductor region of the first pixel and the second semiconductor region of the second pixel; a first well region disposed inside the substrate, between the first semiconductor region of the first pixel and the first semiconductor region of the second pixel, and on the first principal surface; a pixel circuit disposed in the first well region; and a pixel isolation region disposed inside the substrate, between the second semiconductor region of the first pixel and the second semiconductor region of the second pixel. The second semiconductor region and the third semiconductor region form an avalanche multiplication region.

According to the present disclosure, a solid-state imaging device can be realized in which an avalanche photodiode and a pixel circuit are disposed in the same semiconductor substrate while satisfying a high aperture ratio, and which is easily miniaturized and reduces crosstalk.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments of the solid-state imaging device according to the present disclosure are described in detail with reference to the drawings. Configurations that are essentially the same share like reference signs. Accordingly, description thereof may be omitted. The present disclosure is not limited to the following embodiments. Moreover, two or more embodiments of the present disclosure may be combined. Furthermore, the present disclosure does not exclude a structure in which P type and N type are reversed in the following embodiments.

Embodiment 1

First, a structure of a solid-state imaging device according to Embodiment 1 will be described with reference to FIG. 1 and FIG. 2. Note that, in the present specification, "planar view" indicates a view in the direction normal to first principal surface S1 and second principal surface S2 shown in FIG. 1.

Figure 1:
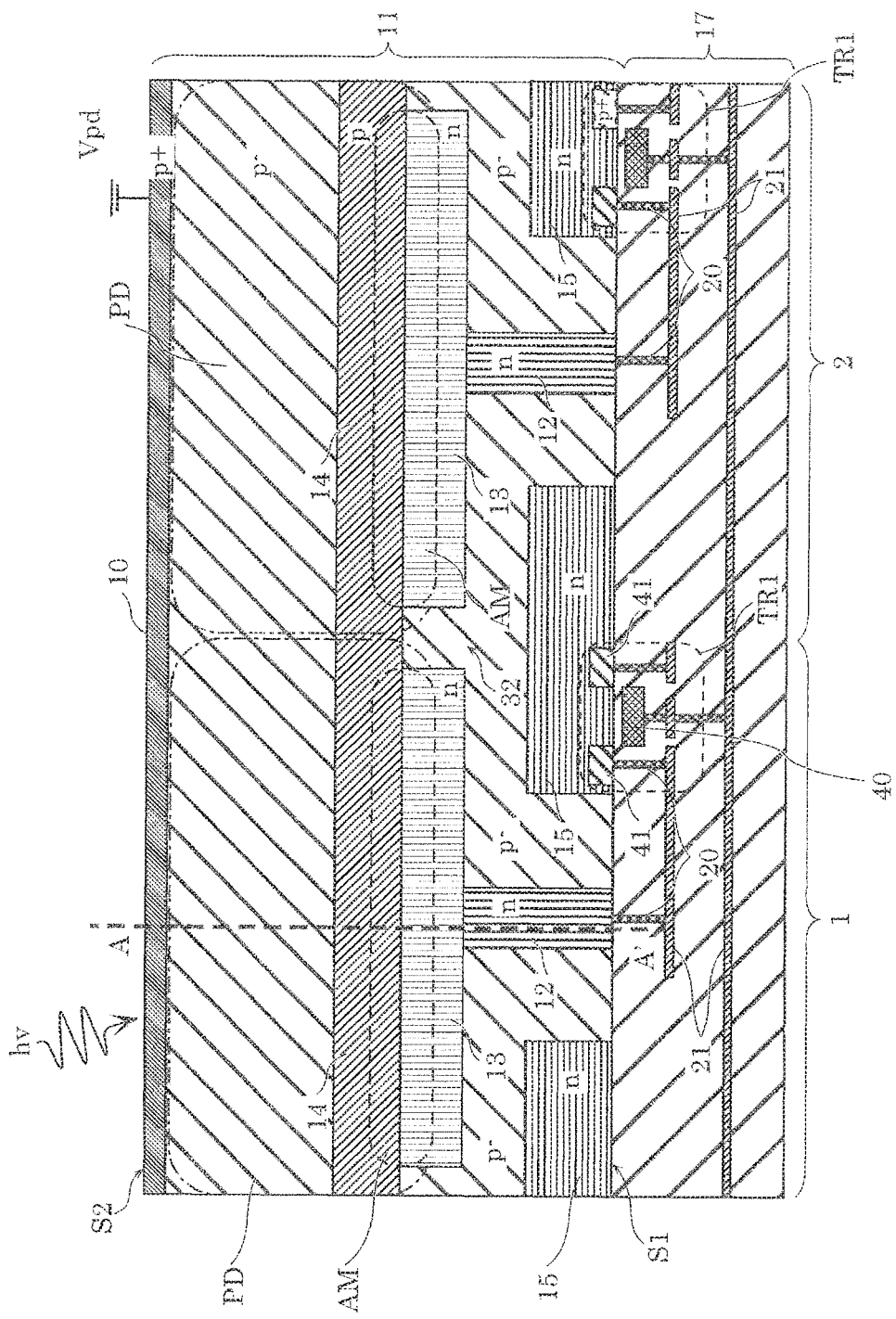
FIG. 1 is a cross-sectional view of a solid-state imaging device according to Embodiment 1 of the present disclosure.
Figure 2:
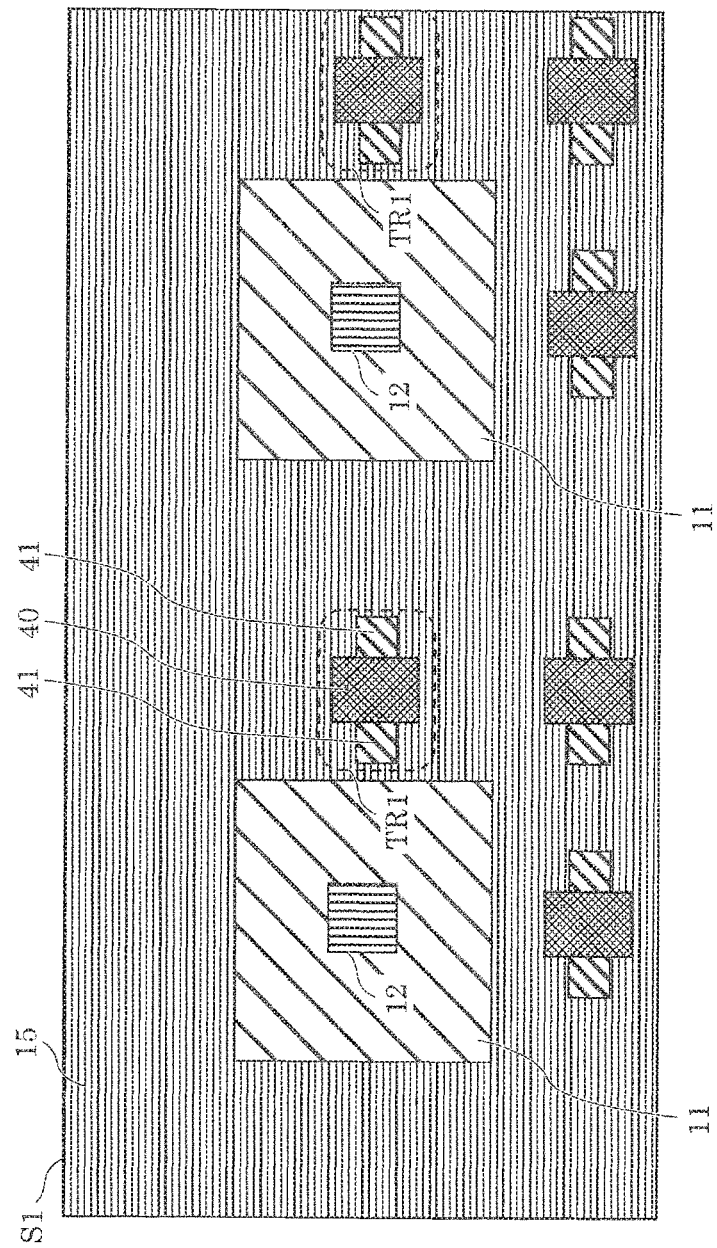
FIG. 2 is a plan view of a first principal surface of the solid-state imaging device according to Embodiment 1 of the present disclosure.
Figure 3:
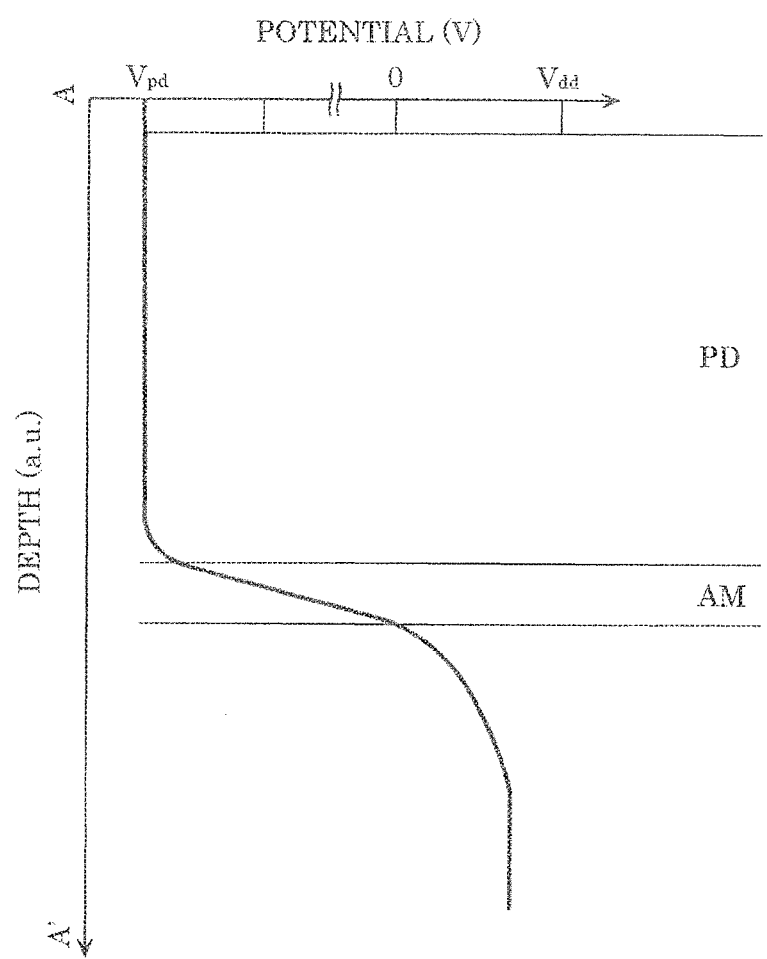
FIG. 3 is a graph showing a potential gradient at A-A' line of FIG. 1 of the solid-state imaging device according to Embodiment 1 of the present disclosure.

FIG. 1 is a cross-sectional view of a pixel array (here, pixel 1 and pixel 2) included in a solid-state imaging device in the case where transistor TR1 is a P channel transistor. FIG. 2 is a plan view of first principal surface S1 of FIG. 1, which is seen in the direction of second principal surface S2. FIG. 2 also illustrates gate electrodes 40 of transistors TR1 for better understanding of the positional relationships. FIG. 3 is a graph showing a potential gradient at A-A' line in FIG. 1, when fixed potential Vpd is applied to P+ type semiconductor region 10. Note that, when simply a "transistor" is referred to in the present embodiment, this means that the transistor is a metal-oxide-semiconductor (MOS) transistor (MOSFET: metal-oxide-semiconductor field-effect transistor). However, a transistor included in the pixel circuit of the solid-state imaging device according to the present embodiment is not limited to a MOS transistor, and may be a junction field-effect transistor (JFET) or a bipolar transistor, or both types of transistors may be used.

As illustrated in FIG. 1, the solid-state imaging device according to the present embodiment includes: a pixel array including a first pixel (pixel 1) and a second pixel (pixel 2) which is adjacent to the first pixel (pixel 1). The pixel array includes: substrate 11 of a first conductivity type (here, P type), substrate 11 having first principal surface S1 and second principal surface S2 which is on a reverse side of first principal surface S1 and where light enters; and wiring layer 17 disposed on first principal surface S1. Substrate 11 includes, as main structural components; (1) a first semiconductor region (N type semiconductor region 12) of a second conductivity type (N type) which is different from the first conductivity type (P type), the first semiconductor region (N type semiconductor region 12) being provided for each of the first pixel (pixel 1) and the second pixel (pixel 2), disposed inside substrate 11 (here, first principle surface S1), and extending in a direction from first principal surface S1 toward second principal surface S2; (2) a second semiconductor region (N type semiconductor region 13) of the second conductivity type (N type) provided for each of the first pixel (pixel 1) and the second pixel (pixel 2), the second semiconductor region (N type semiconductor region 13) being disposed inside substrate 11, between second principal surface S2 and the first semiconductor region (N type semiconductor region 12), and connected to the first semiconductor region (N type semiconductor region 12); (3) a third semiconductor region (P type semiconductor region 14) of the first conductivity type (P type), the third semiconductor region (P type semiconductor region 14) being disposed inside substrate 11, between (i) second principal surface S2 and (ii) the second semiconductor region (N type semiconductor region 13) of the first pixel (pixel 1) and the second semiconductor region (N type semiconductor region 13) of the second pixel (pixel 2); (4) a first well region (N type well 15) disposed inside substrate 11, between the first semiconductor region (N type semiconductor region 12) of the first pixel (pixel 1) and the first semiconductor region (N type semiconductor region 12) of the second pixel (pixel 2), and on first principal surface S1; (5) a pixel circuit (TR1, etc.) disposed in the first well region (N type well 15); and (6) pixel isolation region 32 disposed inside substrate 11, between the second semiconductor region (N type semiconductor region 13) of the first pixel (pixel 1) and the second semiconductor region (N type semiconductor region 13) of the second pixel (pixel 2).

In substrate 11, photoelectric conversion layer PD is formed by the region (p− type semiconductor region) between P+ type semiconductor region 10 formed on second principal surface S2 and P type semiconductor region 14, P type semiconductor region 14, and N type semiconductor region 13. In particular, an avalanche multiplication region (AM) may be formed between P type semiconductor region 14 and N type semiconductor region 13, depending on a bias voltage (reverse bias voltage to photoelectric conversion layer PD) to P+ type semiconductor region 10. In other words, an APD may be formed by P type semiconductor region 14 and N type semiconductor region 13.

More specifically, substrate 11 is a P type silicon substrate, for example. On first principal surface S1 of substrate 11, wiring layer 17 is disposed. Light enters from second principal surface S2 of substrate 11.

On the front surface of substrate 11, which is on a second principal surface S2 side, P+ type semiconductor region 10 is formed. Fixed potential Vpd is applied to P+ type semiconductor region 10 so that the bias to be applied to photoelectric conversion layer PD is a reverse bias. As for P+ type semiconductor region 10, in order to reduce a dark current that occurs due to a crystal defect on second principal surface S2, it is desirable that the impurity concentration of P+ type semiconductor region 10 is at least $10^{18}$ cm$^{-3}$ and is not depleted even at the time of applying a voltage. Moreover, sensitivity for the light having a short wavelength can be enhanced by reducing the thickness of P+ type semiconductor region 10. It is desirable that P+ type semiconductor region 10 is formed to have a thickness of at most 0.5 μm from second principal surface S2, in order to detect blue wavelength light having a short penetration length to a silicon substrate among the visible light. When detection of infrared light is intended, P+ type semiconductor region 10 may be formed to have a thickness of at least 0.5 μm. Conversely, when detection of ultraviolet light is intended, P+ type semiconductor region 10 may be formed only in a region around the electrodes for applying fixed potential Vpd, and not formed in a light receiver (region where light enters). Light that has entered from second principal surface S2 is photoelectrically converted by photoelectric conversion layer PD, and electron-hole pairs that are signal charge are generated. Among the generated signal charge, electrons flow into a first principal surface S1 side along the potential gradient, and move to N type semiconductor region 12 via N type semiconductor region 13.

Here, when fixed potential Vpd is set to a voltage equal to or more than a breakdown voltage (this case is hereinafter referred to as avalanche multiplication drive), the photoelectrically-converted electric charge is avalanche multiplied by avalanche multiplication region AM formed between P type semiconductor region 14 and N type semiconductor region 13. This enables generation of many signal electrons before the electrons reach N type semiconductor region 12, and also enables detection of even a weak light that is usually buried in noise and cannot be detected. Vpd according to the present embodiment has a polarity that serves as a reverse bias to P type semiconductor region 14 and N type semiconductor region 13, and approximately ranges from 10 V to 100 V.

Forming photoelectric conversion layer PD thickly increases the probability of photoelectrical conversion of light that has entered from second principal surface S2. To secure the sensitivity to the wavelength band region of the visible light, the thickness of a region between P+ type semiconductor region 10 and P type semiconductor region 14 is desirably at least 2 μm. Moreover, the impurity concentration in the region between P+ type semiconductor region 10 and P type semiconductor region 14 is designed to have a low impurity concentration (p−) of at most $10^{16}$ cm$^{-3}$, which is approximately the same level of impurity concentration as substrate 11. In other words, the impurity concentration in the region between P type semiconductor region 14 and second principal surface S2 is lower than the impurity concentration of P type semiconductor region 14. This reduces the probability that the electrons generated in photoelectric conversion layer PD recombine, and increases the probability that the electrons reach N type semiconductor region 12.

In order to collect the electrons that are generated by detecting light together in N type semiconductor region 12 that is disposed on first principal surface S1 and formed substantially perpendicularly in each pixel, N type semiconductor region 13 is extended horizontally (direction parallel to the first principal surface and the second principal surface) within substrate 11. P type semiconductor region 14 is formed between N type semiconductor region 13 and P+ type semiconductor region 10.

N type semiconductor region 13 is desirably formed in a depth that is at least 1.5 μm away from first principal surface S1 to prevent electric conduction with N type well 15.

To cause avalanche multiplication, the impurity concentrations of P type semiconductor region 14 and N type semiconductor region 13 are each desirably at least $5 \times 10^{16}$ cm$^{-3}$ and at most $10^{18}$ cm$^{-3}$. By setting the distance between P type semiconductor region 14 and N type semiconductor region 13 to be at least 0.5 μm at the peak positions of the impurity concentrations, it is possible to prevent offset of the impurity concentrations due to diffusion of impurities and to ensure sufficient impurity concentrations to induce avalanche multiplication.

As shown in FIG. 3, in N type semiconductor region 13 and N type semiconductor region 12, for example, a potential barrier is not generated between N type semiconductor region 13 and N type semiconductor region 12 for drain potential Vdd to be applied to the drain of transistor TR1, in a state in which fixed potential Vpd is applied to P+ type semiconductor region 10. This prevents the signal charge after photodetection from remaining inside the substrate over a plurality of frames in image capturing, and reduces a residual image. Moreover, N type semiconductor region 12 and N type semiconductor region 13 are formed with the impurity concentration of at least $10^{16}$ cm$^{-3}$. In particular, the impurity concentration of N type semiconductor region 12 may be varied according to a depth direction and a higher impurity concentration may be used on the first principal surface S1 side. This helps electrons that are signal charge to be accumulated in the front surface of the substrate, and facilitates reading out of signals.

Here, in order to form photoelectric conversion layer PD that has an avalanche multiplication region and the pixel circuit on the same substrate, N type well 15 may be formed in a region away from N type semiconductor region 12 and N type semiconductor region 13, and transistor TR1 of P channel may be formed inside the region. By using a P channel transistor instead of an N channel transistor, the voltage of N type well 15, which is a well region of transistor TR1 of P channel, is not easily varied even when a high voltage is applied to P+ type semiconductor region 10. Thus, the driving of the pixel circuit having transistor TR1 is less likely to be interfered. Moreover, since there is no pixel circuit in the P type semiconductor region in first principal surface S1, it is not necessary to apply the fixed voltage.

N type semiconductor region 13 needs to be formed in a depth that enables electrical isolation from N type well 15. Moreover, N type well 15 needs to be electrically isolated from N type semiconductor region 12. Therefore, a P type semiconductor region or shallow trench isolation (STI), for example, may be formed between N type well 15 and N type semiconductor region 12.

Transistor TR1 is a part of the pixel circuit for reading out signal charge that has flowed into N type semiconductor region 12. Gate electrode 40 and diffusion regions (the source region and drain area) 41 of transistor TR1 are connected to wiring 21 via contact plugs 20.

With the above configuration, in the solid-state imaging device according to the present embodiment, the APDs and the pixel circuits are embedded in one substrate 11 and the pixel circuit is formed below photoelectric conversion layer PD. Thus, a solid-state imaging device can be realized in which the APDs and the pixel circuits are formed in the same substrate while maintaining a high aperture ratio.

In addition, in order to ensure that N type semiconductor regions 13 are electrically isolated from adjacent pixels even when a voltage less than the breakdown voltage is applied to P+ type semiconductor region 10 (such voltage application is hereinafter referred to as "normal driving"), N type semiconductor regions 13 of adjacent pixels are isolated by pixel isolation region 32 formed by the P type semiconductor region or the N type semiconductor region having a low impurity concentration. Pixel isolation region 32 has a structure in which a potential barrier against electrons is provided. With this configuration, an image can be captured under a voltage condition which does not cause a breakdown. Color mixture of the captured image is reduced by the pixel isolation region even with a brightness of daylight. Therefore, when a scene is captured in which a dark area and a bright area coexist, a clear image having a wide dynamic range can be obtained by using, for example, image processing in which an image is captured by the avalanche multiplication driving, and then another image is captured by usual normal-driving which does not perform multiplication, and combining both images. As described above, in the solid-state imaging device according to the present embodiment, pixel isolation region 32 is disposed inside substrate 11, between N type semiconductor region 13 of the first pixel (pixel 1) and N type semiconductor region 13 of the second pixel (pixel 2). Thus, crosstalk, in which signal charge generated in a pixel leaks to an adjacent pixel, is reduced.

Note that the solid-state imaging device according to the present embodiment having a configuration as described above is produced by the following process steps, for example. The solid-state imaging device according to the present embodiment is basically produced from the lower layer toward the upper layer, in a state where the solid-state imaging device illustrated in FIG. 1 is turned upside down. First, a substrate having a p− type semiconductor region formed on P+ type semiconductor region 10 is prepared. On the substrate, P type semiconductor region 14 is formed by ion implantation. Then, on P type semiconductor region 14, N type semiconductor region 13 is formed on all pixels by ion implantation. After that, by inverting a part of N type semiconductor region by, for example, patterning by photolithography and ion implantation using P type impurities, N type semiconductor regions 13 and pixel isolation regions 32 are formed. Subsequently, N type semiconductor regions 12 and N type wells 15 are formed by patterning by photolithography, ion implantation, etc. Then, in each N type well 15, diffusion regions 41 (source and drain) are formed by patterning by photolithography, ion implantation, etc. As for wiring layer 17, an insulating layer is formed on substrate 11 that has undergone the above process steps, and the insulating layer, gate electrodes 40, contact plugs 20, and wiring 21 are formed by patterning by photolithography, etching, a spattering process, etc.

Both or at least one of P type semiconductor region 14 and N type semiconductor region 13 may be produced by varying the impurity concentration at some point during forming of semiconductor substrate 11 by epitaxial growth. With this method, crystal defects in avalanche multiplication region AM are reduced compared to the case where ion implantation is used, and noise can also be reduced.

Next, exemplary configurations of a pixel array using pixel 1 according to Embodiment 1 described above and pixel end (pixel array end) 3 that is outside the pixel array are described with reference to FIG. 4 and FIG. 5.

Figure 4:
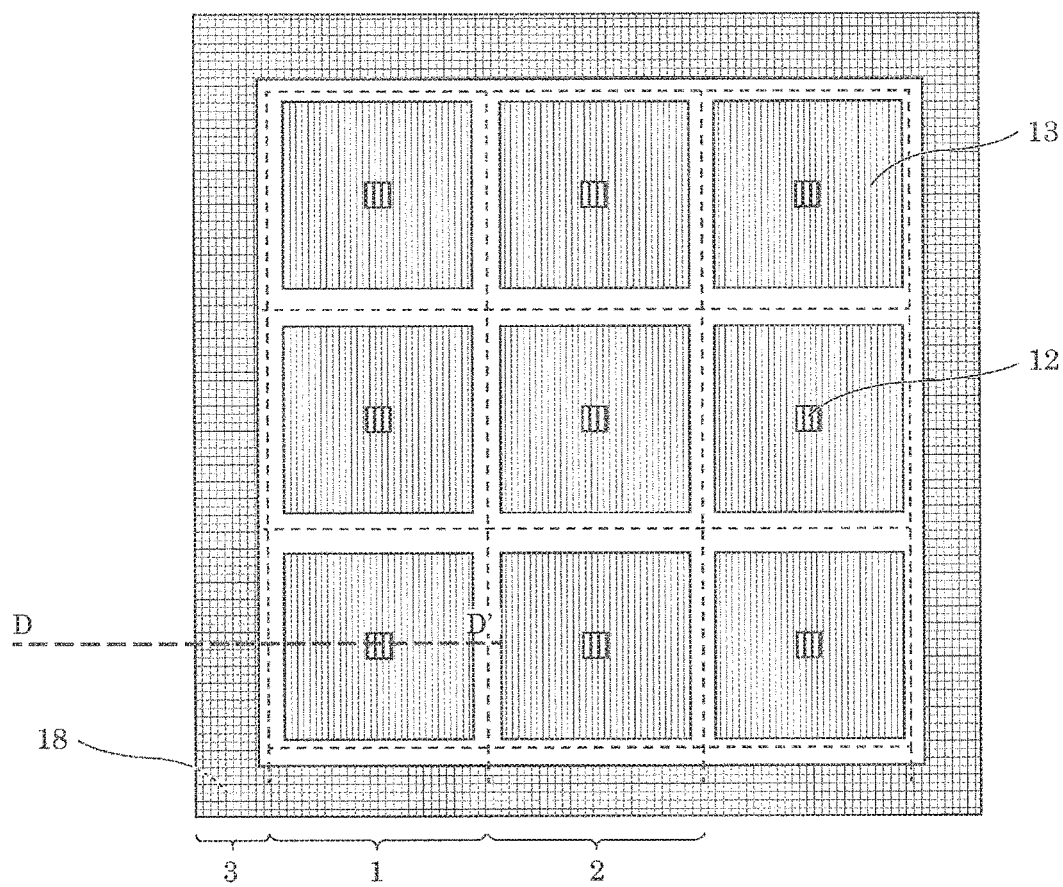
FIG. 4 is a plan view including a pixel end of the solid-state imaging device according to Embodiment 1 of the present disclosure.

FIG. 4 is a plan view including a 3×3 pixel array and pixel end 3. In the pixel array, only N type semiconductor regions 12 and N type semiconductor regions 13 are illustrated in the drawing for simplification. Pixel end 3 has a structure in which N type semiconductor region 18, which is an example of a fourth semiconductor region, is disposed to be in contact with first principal surface S1 and surround the pixel array.

Figure 5:
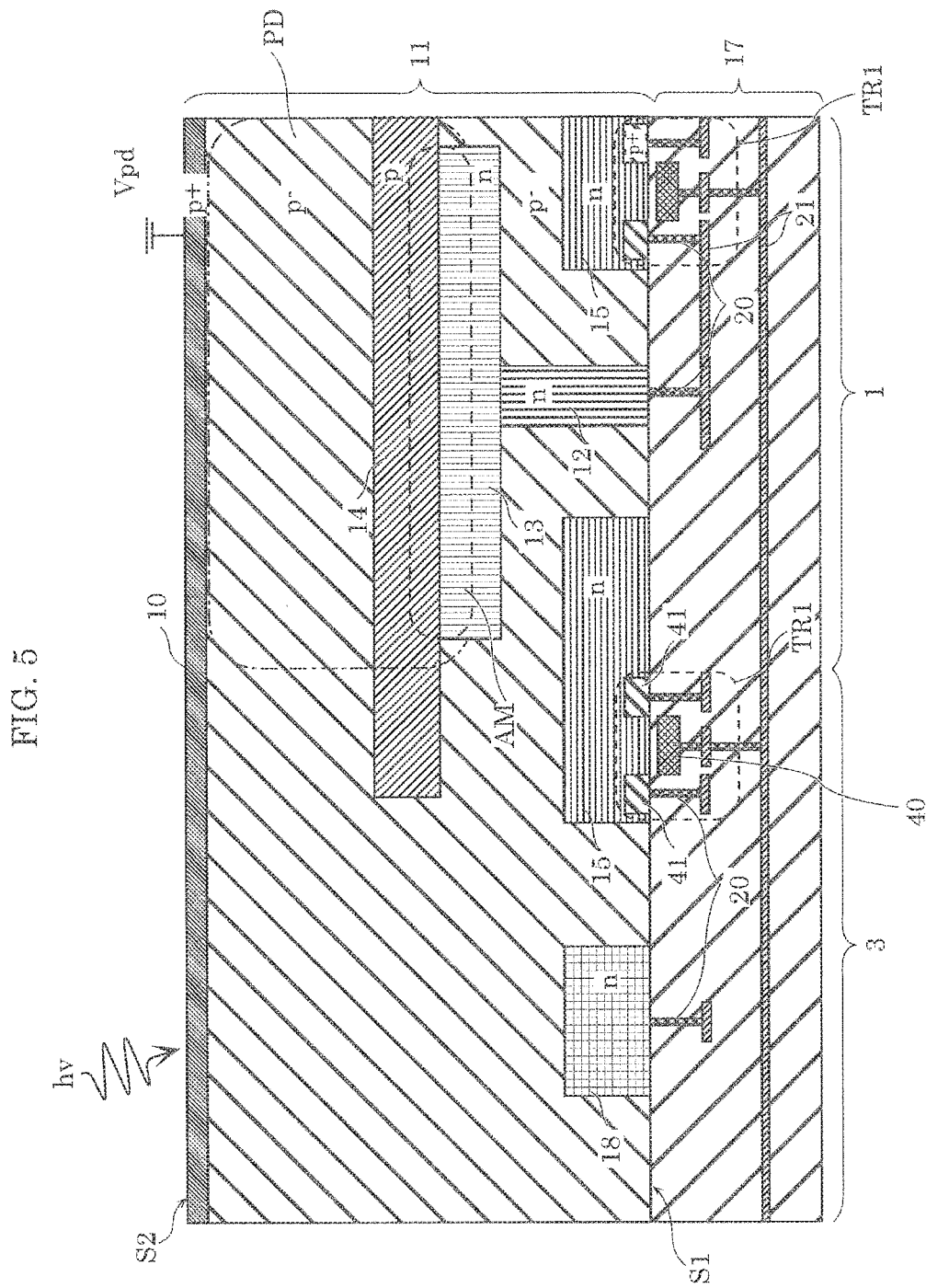
FIG. 5 is a cross-sectional view taken along D-D' line in FIG. 4, including the pixel end of the solid-state imaging device according to Embodiment 1 of the present disclosure.

FIG. 5 is a cross-sectional view taken along D-D' line in FIG. 4. Application of a fixed voltage (for example, 3.3 V) to N type semiconductor region 18 reduces the leakage current flowing into the pixel array. The leakage current occurs outside the pixel array on first principal surface S1 due to a surface defect.

In order not to cause avalanche multiplication between N type semiconductor region 18 and P type semiconductor region 14, N type semiconductor region 18 is formed in a region closer to the first principal surface S1 side than N type semiconductor region 13. Alternatively, a voltage by which the electric field intensity between N type semiconductor region 18 and P type semiconductor region 14 becomes lower than that in the pixel array is applied. In the present embodiment, in order to lower the electric field intensity between N type semiconductor region 18 and P type semiconductor region 14 than the electric field intensity in the pixel array, N type semiconductor region 18 is formed such that the gradient of the impurity concentration in the PN junction which is formed by N type semiconductor region 18 and a region contacting N type semiconductor region 18 in substrate 11 is smaller than the gradient of the impurity concentration in the PN junction formed by N type semiconductor region 18 and P type semiconductor region 14. With this configuration, consumption of unnecessary power can be reduced in pixel end 3. Note that the intensity of the electric field formed between P type semiconductor region 14 and N type semiconductor region 18 may be reduced by forming P type semiconductor region 14 only in the pixel array (not formed in pixel end 3) as illustrated in FIG. 5.

Embodiment 2

Figure 6:
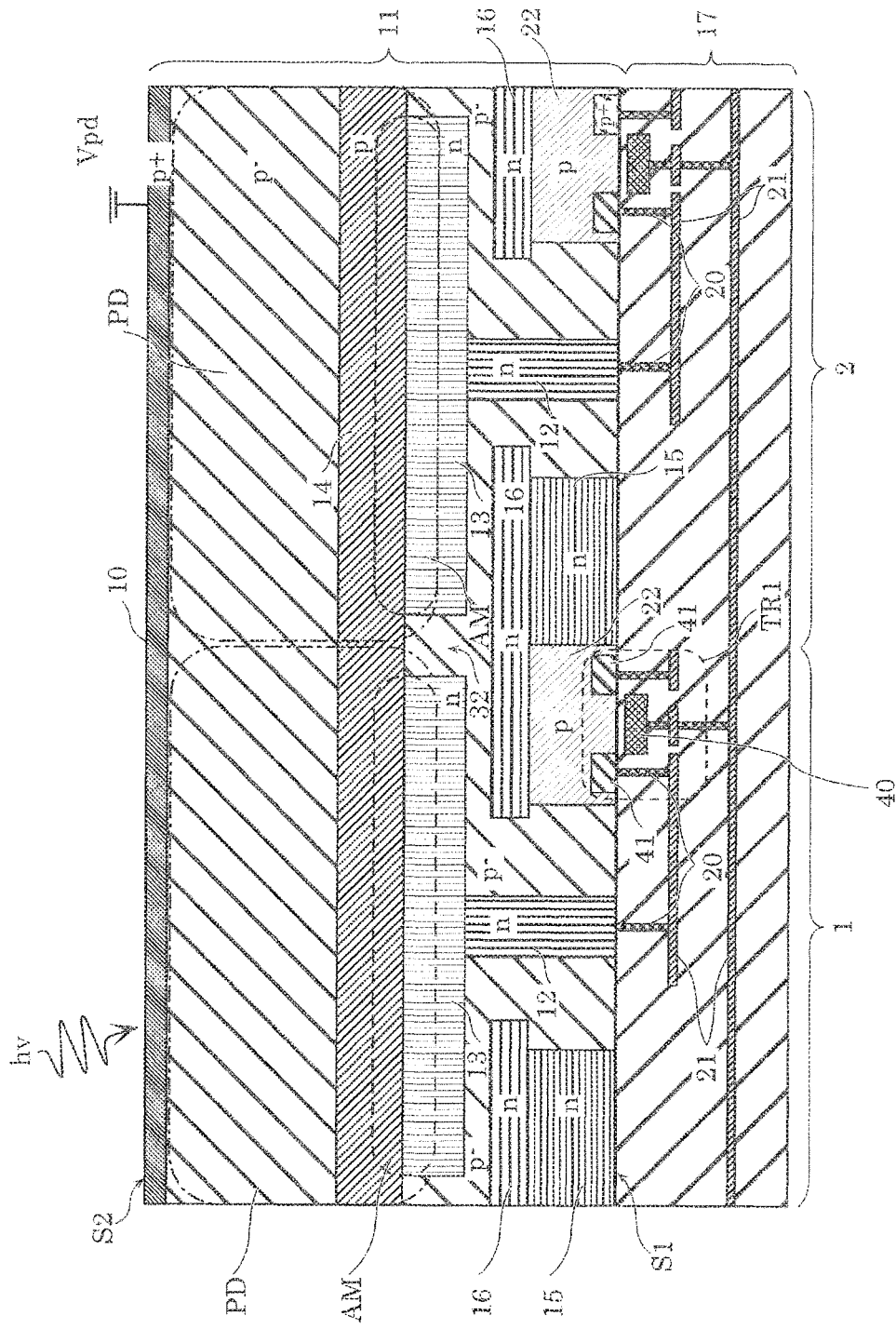
FIG. 6 is a cross-sectional view of a solid-state imaging device according to a variation of Embodiment 1 of the present disclosure.
Figure 7:
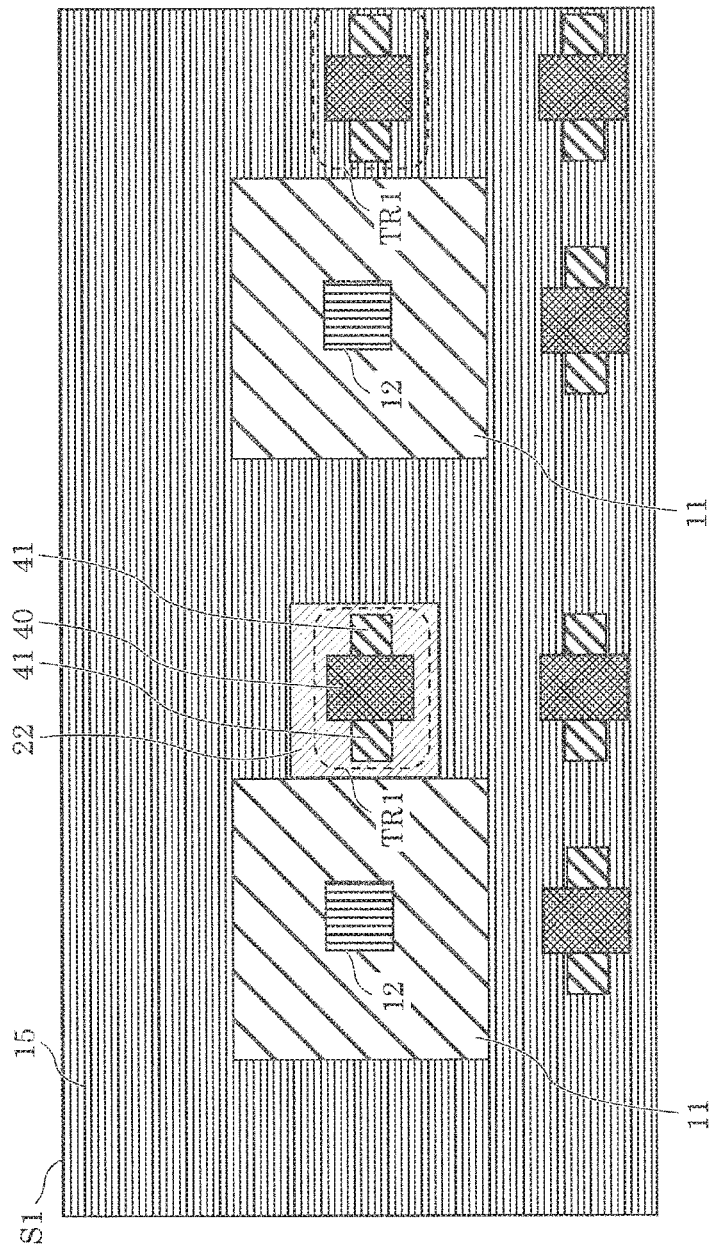
FIG. 7 is a plan view of a first principal surface of the solid-state imaging device according to the variation of Embodiment 1 of the present disclosure.

Next, a structure of a solid-state imaging device according to Embodiment 2 is described with reference to FIG. 6. FIG. 6 is a cross-sectional view of the solid-state imaging device according to Embodiment 2 in the case where transistor TR1 is an N channel transistor. FIG. 7 is a plan view of first principal surface S1 in FIG. 6, which is viewed in the direction of second principal surface S2. FIG. 7 also illustrates gate electrodes 40 of the transistors for better understanding of the positional relationships.

In this case, it is necessary to form P type well 22 in each N type well 15. P type well 22 is another example of the first well region for forming transistor TR1. Even at the time of the avalanche multiplication driving, the potential of P type well 22 should be fixed to determine the voltage for driving the N channel transistor TR1. In order to achieve this, since P+ type semiconductor region 10 to which fixed potential Vpd is applied needs to be electrically isolated from P type well 22, each N type semiconductor region 13 needs to have a sufficient thickness or a sufficient impurity concentration. For example, the thickness of N type semiconductor region 13 is at least 0.5 µm, and the impurity concentration is at least $10^{17}$ cm$^{-3}$. P type well 22 is electrically isolated from P+ type semiconductor region 10 and P type semiconductor region 14 by such N type semiconductor region 13 and pixel isolation region 32.

Here, N type semiconductor regions 13 need to be electrically isolated from adjacent pixels in order to reduce color mixture. Accordingly, in the present embodiment, each N type semiconductor region 13 is formed spaced apart from adjacent pixels. However, since the electrical isolation between P+ type semiconductor region 10 and P type well 22 becomes more difficult as the distance between the adjacent N type semiconductor regions 13 is farther so as to prevent the color mixture between pixels, a problem of a narrow design margin for realizing the device is assumed.

In view of the above, in the present embodiment, N type well 16, which is an example of a second well region, is disposed such that N type well 16 is in contact with N type well 15 and P type well 22. N type well 16 is disposed between P type well 22 and N type semiconductor region 13 and is electrically isolated from N type semiconductor region 13. The P type semiconductor regions between N type semiconductor region 13 and N type well 16 and between N type semiconductor region 12 and N type well 16 are depleted. Accordingly, the potential barrier against electrons is formed in the P channel (p− type semiconductor region) between P type well 22 and P+ type semiconductor region 10, and P type well 22 can be electrically isolated from fixed potential Vpd.

Assuming the case of capturing a high luminance object and the case of capturing with a multiplication factor exceeding the number of saturation electrons, the electric charge that is excessively accumulated in N type semiconductor region 12 of pixel 1 flows through N type semiconductor region 13 into an adjacent N type semiconductor region 12 of pixel 2, and this may cause blooming. In view of this, blooming can be reduced by discharging the excessive electric charge to N type well 16.

For this purpose, the impurity concentration of pixel isolation region 32, and the impurity concentration of the P type semiconductor region between (i) N type semiconductor region 12 and (ii) N type well 16 and P type well 22 are set such that the potential barrier against electrons of pixel isolation region 32 between adjacent N type semiconductor regions 13 is higher than the potential barrier against the electrons of the P type semiconductor region between N type semiconductor region 12 and N type well 16.

As illustrated in FIG. 6, when the impurity concentration of pixel isolation region 32 is approximately the same level as the impurity concentration of the P type semiconductor region between N type semiconductor region 12 and N type well 16, the potential barrier against electrons of pixel isolation region 32 is formed higher than the potential barrier against electrons of the P type semiconductor region between N type semiconductor region 12 and N type well 16. This is because pixel isolation region 32 is disposed in a position close to the second principal surface S2 side to which fixed potential Vpd that is a negative bias is applied.

Moreover, since color mixture is also reduced by absorbing part of electric charge that is photoelectrically converted on the pixel boundary, formation of the light-shielding film for reducing color mixture is omissible on the second principal surface S2 side. The range of absorbing the signal charge detected on the pixel boundary can be adjusted with the impurity concentration and width of N type well 16, and the reverse bias voltage to be applied to N type well 16.

Embodiment 3

Figure 8:
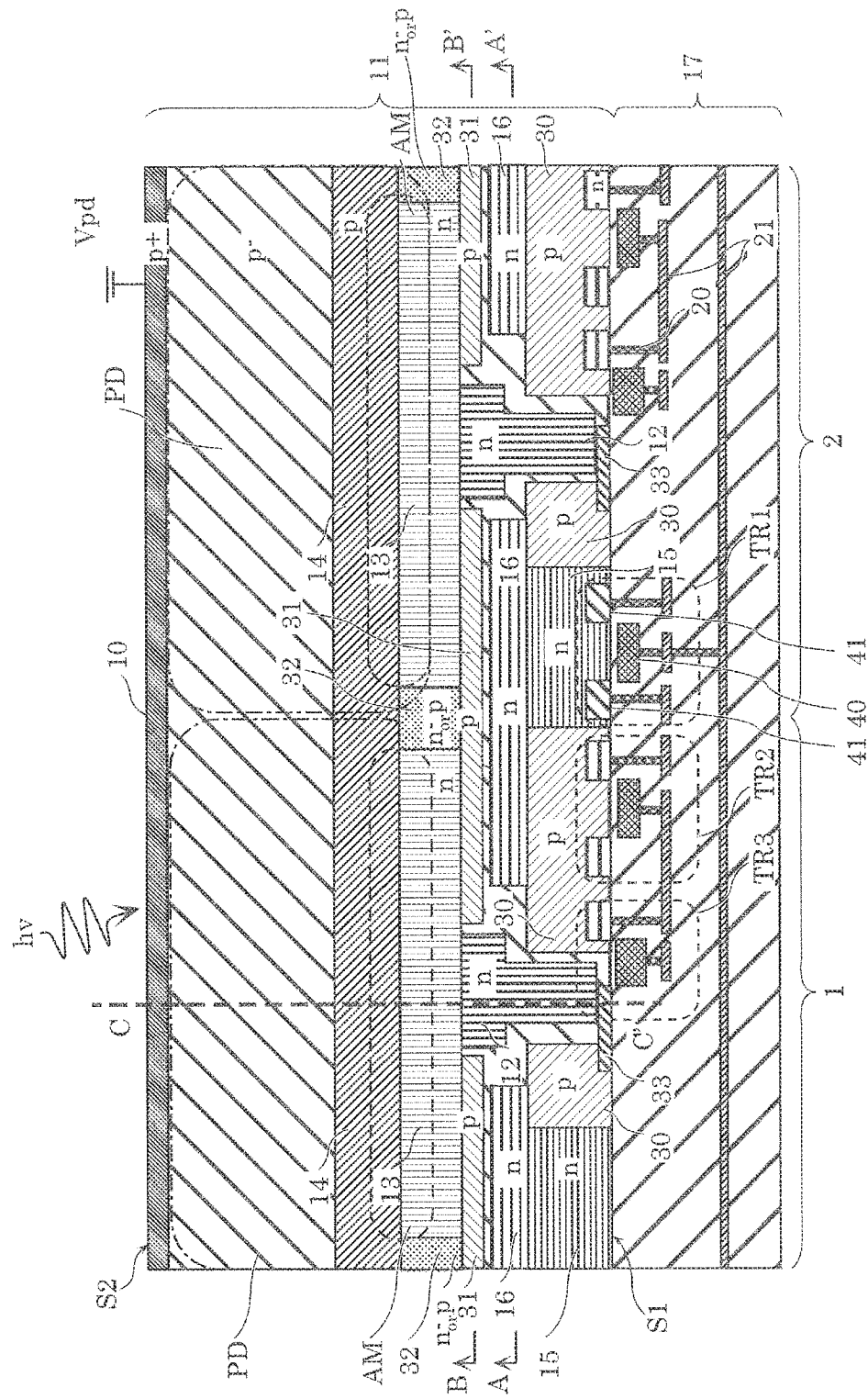
FIG. 8 is a cross-sectional view of a solid-state imaging device according to Embodiment 2 of the present disclosure.
Figure 9:
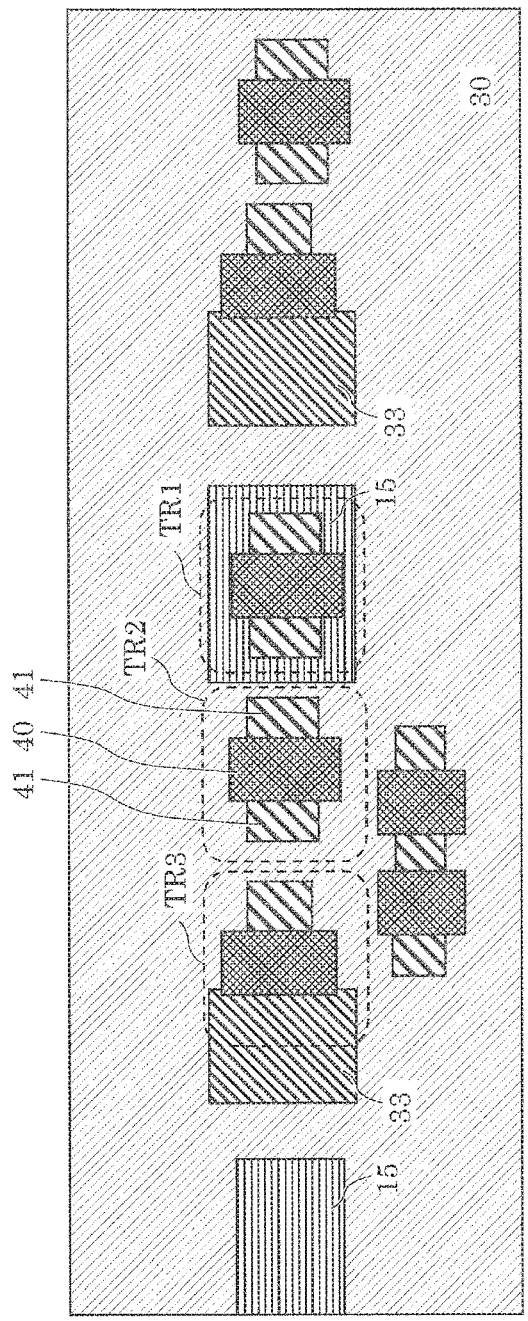
FIG. 9 is a plan view of a first principle surface of the solid-state imaging device according to Embodiment 2 of the present disclosure.
Figure 10:
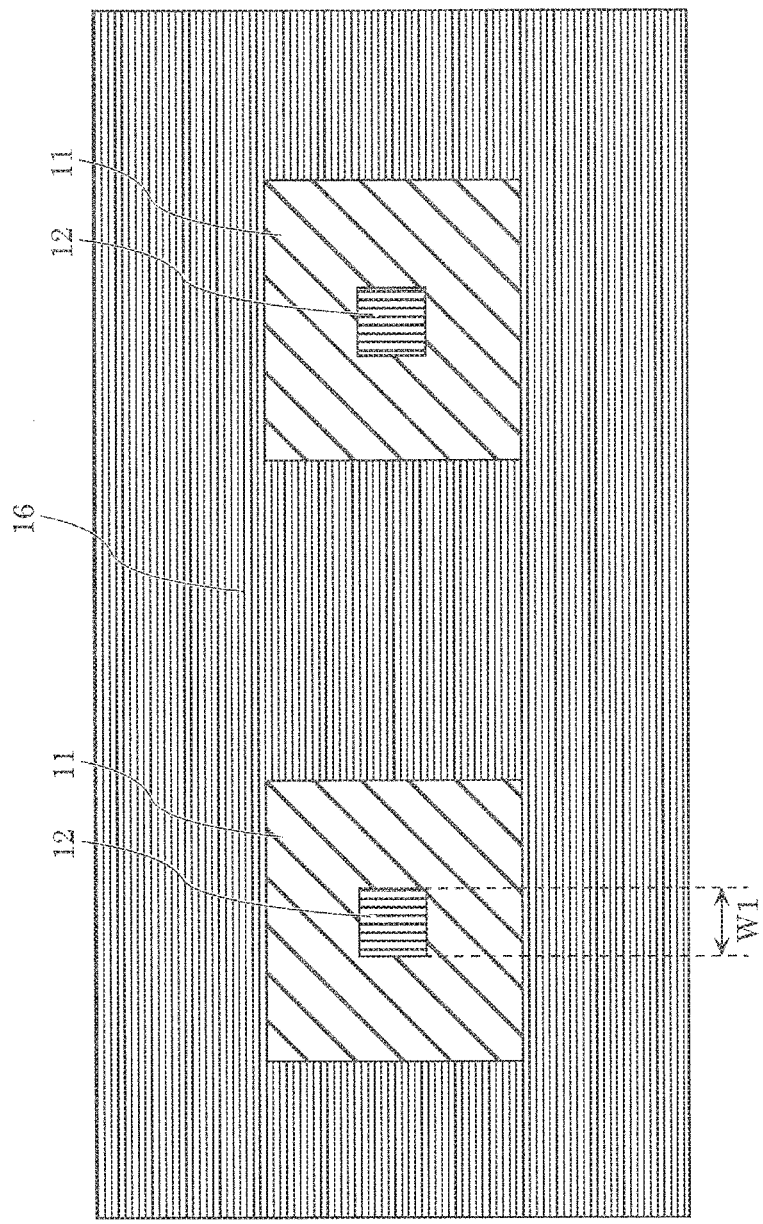
FIG. 10 is a plan view of a plane including A-A' line in FIG. 8 of the solid-state imaging device according to Embodiment 2 of the present disclosure.
Figure 11:
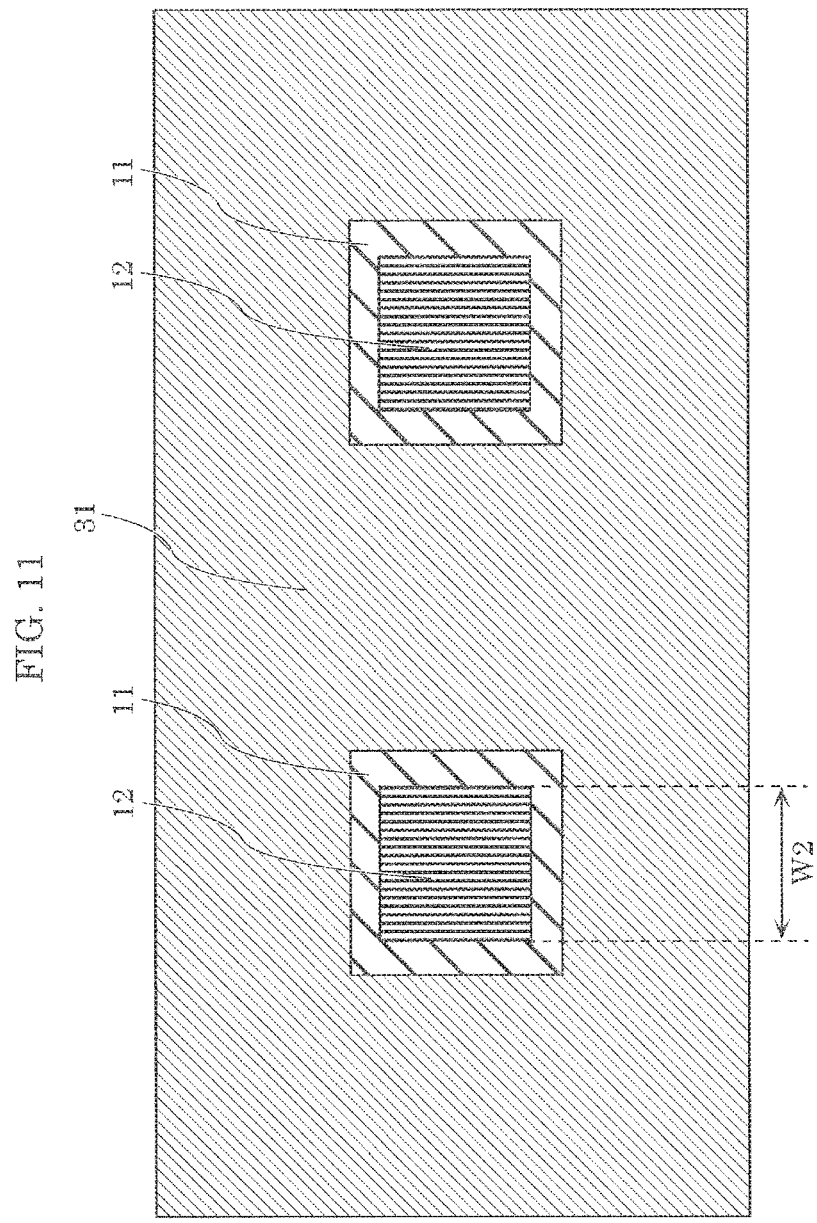
FIG. 11 is a plan view of a plane including B-B' line in FIG. 8 of the solid-state imaging device according to Embodiment 2 of the present disclosure.
Figure 12:
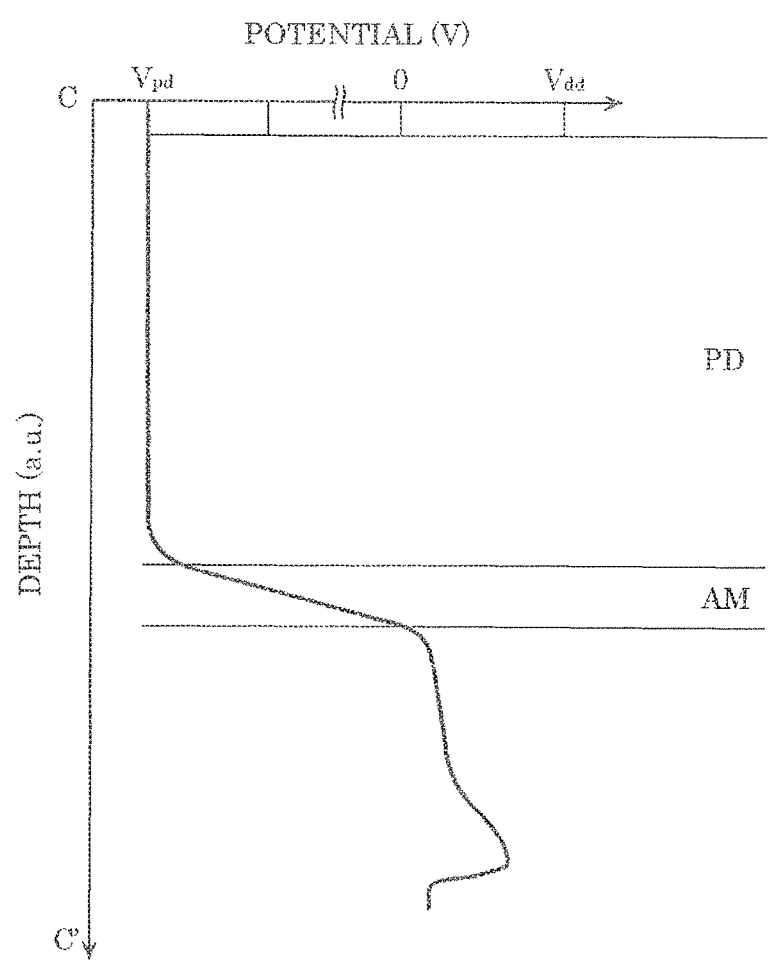
FIG. 12 is a graph showing a potential gradient at C-C' line in FIG. 8 of the solid-state imaging device according to Embodiment 2 of the present disclosure.

FIG. 8 is a cross-sectional view of a solid-state imaging device according to Embodiment 3. FIG. 9 is a plan view of first principal surface S1 in FIG. 8, which is viewed in the direction of second principal surface S2. FIG. 9 also illustrates gate electrodes 40 of the transistors for better understanding of the positional relationships. FIG. 10 is a plan view when the cross-section taken along line A-A' of FIG. 8 is viewed in the direction of second principal surface S2. FIG. 11 is a plan view when the cross-section taken along line B-B' of FIG. 8 is viewed in the direction of second principal surface S2. FIG. 12 is a graph showing the potential gradient at C-C' line of FIG. 8 when fixed potential Vpd is applied to P+ type semiconductor region 10. In FIG. 8 to FIG. 12, elements that are essentially the same as Embodiment 1 share like reference signs. Moreover, the following description will focus on the points different from Embodiment 1.

Between N type semiconductor region 13 of pixel 1 and N type semiconductor region 13 of pixel 2 which is adjacent to pixel 1, pixel isolation region 32 is formed of a region (n-type semiconductor field) having an impurity concentration lower than the impurity concentration of N type semiconductor region 13 of pixel 1 and the impurity concentration of N type semiconductor region 13 of pixel 2, or formed of P type semiconductor region. With this, the electric field intensity between P type semiconductor region 14 and pixel isolation region 32 disposed on the boundary of pixels is lower than the electric field intensity between P type semiconductor region 14 and N type semiconductor region 13, and signal multiplication of the color mixture components resulting from the photoelectric conversion in the pixel boundary can be reduced.

Moreover, P type semiconductor region 31 is formed between N type well 16 and N type semiconductor region 13 by implanting P type impurities to enhance electrical isolation. Furthermore, in N type semiconductor region 12, width w1 on the second principal surface S2 side illustrated in FIG. 11 is greater than width w2 on the first principal surface S1 side illustrated in FIG. 10. In other words, in N type semiconductor region 12, the cross-sectional area (cross-section taken along B-B' line) of a plane parallel to first principal surface S1 on the second principal surface S2 side is larger than the cross-sectional area (cross-section taken along A-A' line) of a plane parallel to first principal surface S1 on the first principal surface S1 side. With such a configuration, the electrons generated by the photoelectric conversion in photoelectric conversion layer PD drift toward N type semiconductor region 12 easily, and the sensitivity of the solid-state imaging device can be improved.

Moreover, in the present embodiment, as illustrated in FIG. 8 and FIG. 9, P type wells 30 that are another example of the first well region are formed at positions contacting first principal surface S1 inside substrate 11, and N type well 15 is formed inside each P type well 30. N channel transistors (such as TR2) are formed in P type well 30, and a P channel transistor (such as TR1) is formed in N type well 15. In order to electrically isolate P+ type semiconductor region 10 to which a high voltage is applied from P type well 30, a reverse bias is applied to N type well 16 via N type well 15. With this, since P type semiconductor region 31 can be depleted, electrical conduction between P+ type semiconductor region 10 and P type well 30 through the P type semiconductor regions can be prevented.

N type semiconductor region 13 is desirably formed in a depth that is at least 2 μm away from first principal surface S1 to prevent electrical conduction with N type well 16. Moreover, in order to allow signal charge to flow into N type well 16 from N type semiconductor region 12 when light signals are saturated by excessive photoelectric conversion and excessive multiplication, the impurity concentration of each P type semiconductor region between N type semiconductor region 12 and N type well 16 is lower than the other surrounding isolation regions.

On the front surface of N type semiconductor region 12 which is on the first principal surface S1 side, P+ type semiconductor region (surface inactive region) 33 is formed between N type semiconductor region 12 and first principal surface S1. With this configuration, N type semiconductor region 12 is to be embedded in a region away (deep) from first principal surface S1 having more crystal defects than inside substrate 11. Thus, the leakage current resulting from many crystal defects which exist in the substrate surface (first principal surface S1) can be reduced. With this, the image quality improves even in the normal driving which does not perform avalanche multiplication, and thus a large dynamic range can be ensured.

In N type semiconductor region 13 and N type semiconductor region 12, for example, the potential barrier is not generated between N type semiconductor region 13 and N type semiconductor region 12 in a state where fixed potential Vpd is applied to P+ type semiconductor region 10, as shown in FIG. 3. This can prevent the signal charge after photon detection from remaining inside the substrate over a plurality of frames, and reduce a residual image. Moreover, N type semiconductor region 12 and N type semiconductor region 13 are formed to have an impurity concentration of at least $10^{16}$ cm$^{-3}$. In particular, the impurity concentration of N type semiconductor region 12 is varied according to the depth direction such that the first principal surface S1 side has a higher impurity concentration. This helps the electrons that are signal charge to be accumulated in the substrate surface (first principal surface S1), and facilitates reading out of signals.

Since the outermost surface of first principal surface S1 in the region including C-C' line of FIG. 8 is covered by P+ type semiconductor region 33, the potential is 0 V which is the same potential as P type well 30. In order to allow the signal charge that is accumulated when transfer transistor TR3 is turned ON to flow into the drain side of transfer transistor TR3, N type semiconductor region 12 at the time of resetting is depleted. Transfer transistor TR3 will be described in the following. As shown in FIG. 12, the peak position of the potential is on the negative side than voltage Vdd applied to the drain of transfer transistor TR3.

Moreover, in the present embodiment, as illustrated in FIG. 8, transfer transistor TR3 of N type channel is disposed to transfer the electric charge accumulated in N type semiconductor region 12. This transfer transistor TR3 is an example of a MOS transistor whose source region is N type semiconductor region 12. Furthermore, in order to detect the signals corresponding to the amount of the transferred electric charge, amplification transistor TR2 is also given as an example.

The conductivity type of the transistor to be disposed may be only the N channel. However, by forming N type well 15 in contact with N type well 16, transistor TR1 of P channel can be formed in N type well 15, and the flexibility of the circuit design can be increased.

Although not illustrated in the drawings, it is also possible to reduce color mixture without N type well 16. In this case, in order to form the potential barrier between pixels and electrically isolate P+ type semiconductor region 10 from P type well 30, the isolation width or the impurity concentration of pixel isolation region 32 needs to be optimized. In this case, after forming N type semiconductor region 13 over all pixels using an ion implantation or an epitaxial growth method, the impurity concentration may be optimized by implanting P type impurities so that the N type semiconductor region between pixels may be inverted and by forming pixel isolation region 32.

In the present embodiment, as illustrated in FIG. 8, it is possible to dispose a pixel circuit also on the boundary of the adjacent photodiodes in planar view, by forming photoelectric conversion layer PD on the second principal surface S2 side which is a reverse side of first principal surface S1 on which the pixel circuits are formed. With this configuration, the area in which the pixel circuit can be disposed, which is a challenge at the time of miniaturization, is larger than a general image sensor. Furthermore, the flexibility of the circuit design can be increased.

Next, exemplary configurations of a pixel array using pixel 1 according to Embodiment 2 and Embodiment 3 described above and of pixel end 3 which is outside the pixel array are described with reference to FIG. 13 and FIG. 14.

In a solid-state imaging device including the pixel array and pixel end 3, it is necessary to reduce the avalanche multiplication in pixel end 3 and to make the capability of electrically isolating P+ type semiconductor region 10 and P type well 22 in pixel end 3 equivalent to that inside the pixel array.

Figure 13:
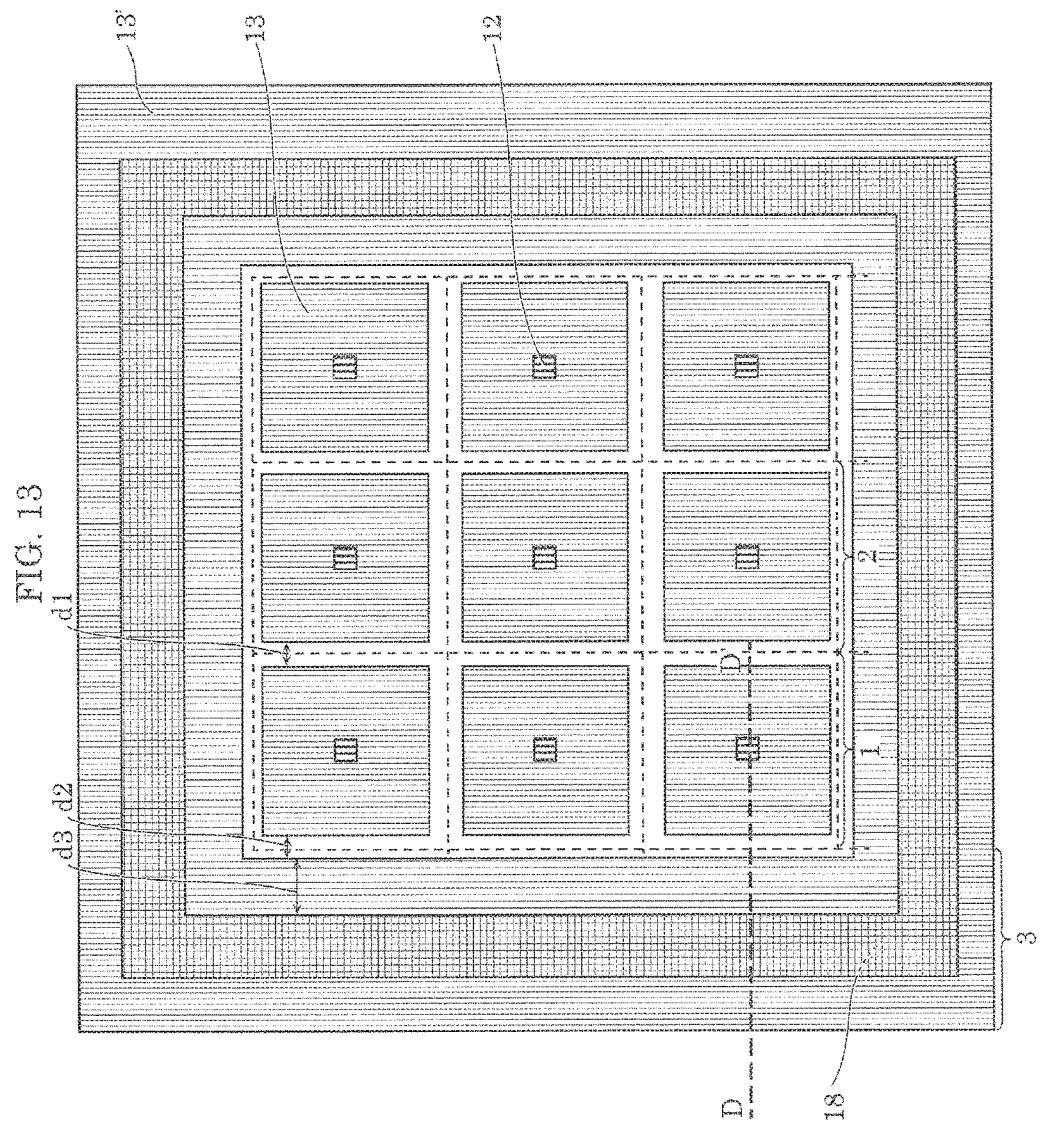
FIG. 13 is a plan view including a pixel end of the solid-state imaging device according to Embodiment 2 of the present disclosure.

FIG. 13 is a plan view of a 3×3 pixel array and pixel end 3. In the pixel array, only N type semiconductor regions 12 and N type semiconductor regions 13 are illustrated in the drawing for simplification. Pixel end 3 has a structure in which N type semiconductor region 18 is disposed to be in contact with first principal surface S1 and surround the pixel array. Application of a fixed voltage to N type semiconductor region 18 reduce the leakage current that occurs on first principal surface S1 flowing into the pixel array. Furthermore, as illustrated in FIG. 14, also in pixel end 3, N type semiconductor region 13', which is an example of a fifth semiconductor region, is disposed such that N type semiconductor region 13' is connected to N type semiconductor region 18. Hereinafter, N type semiconductor region 13 in pixel end 3 is referred to as N type semiconductor region 13'.

As illustrated in FIG. 13, isolation width (interval) d1 of N type semiconductor region 13 between pixel 1 and pixel 2 is formed to have the same width as isolation width (interval) d2 between N type semiconductor region 13 and N type semiconductor region 13' of pixel 1. Alternatively, isolation width (interval) d1 may be formed so that difference (difference between isolation width d1 and isolation width d2) from isolation width d2 is at most 1 μm (however, isolation width d1 may be larger or smaller than isolation width d2). With this, it is possible to enhance the capability of electrically isolating P+ type semiconductor region 10 and P type well 22 to be equivalent to that inside the pixel array also in pixel end 3.

As described above, in the present embodiment, in order to electrically isolate P+ type semiconductor region 10 from P type well 30, N type semiconductor region 18 that surrounds the circumference of the pixel circuit, and N type semiconductor regions such as N type semiconductor region 13 and N type semiconductor region 13' that are disposed closer to the second principal surface S2 side than the pixel circuit side may be formed.

Width dimension d3 of the region above N type semiconductor region 13' and closer to the pixel array side than N type semiconductor region 18 can be designed arbitrarily as long as the width dimension is in a size with which the P type channel (p− type semiconductor region) between N type semiconductor region 13' and N type well 16 can be closed when a voltage is applied to N type semiconductor region 18. This is because width dimension d3 has minor influence on the capability of electrically isolating P+ type semiconductor region 10 from P type well 22.

Figure 14:
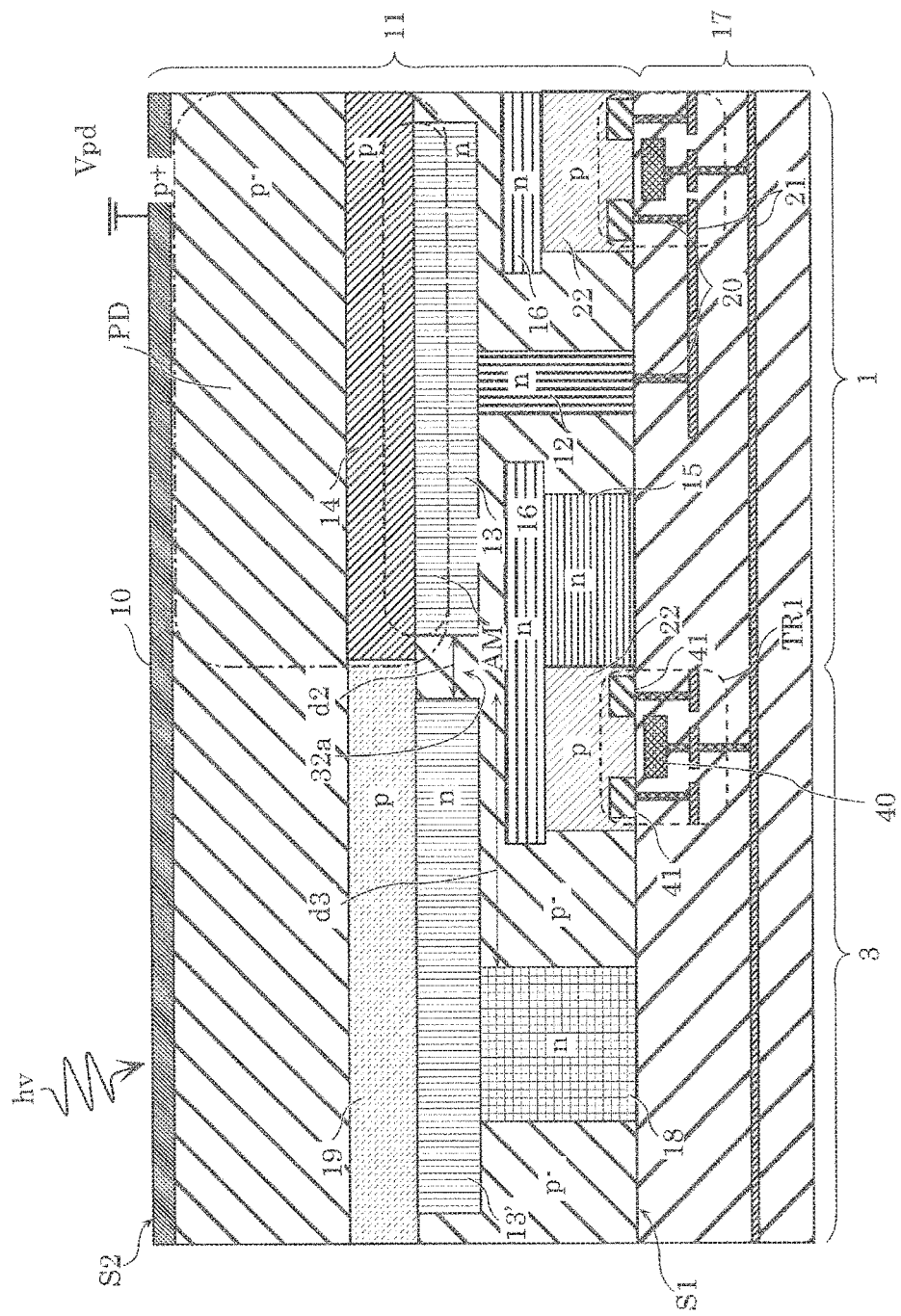
FIG. 14 is a cross-sectional view taken along D-D' line in FIG. 13, including the pixel end of the solid-state imaging device according to Embodiment 2 of the present disclosure.

FIG. 14 illustrates a cross-sectional view taken along D-D' line in FIG. 13. In this exemplary configuration, P type semiconductor region 19 in pixel end 3 is formed in the same depth as P type semiconductor region 14 in the pixel, as compared with the inside of a pixel array.

The impurity concentration of P type semiconductor region 19 is lower than the impurity concentration of P type semiconductor region 14. With this, the avalanche multiplication in pixel end 3 and unnecessary power dissipation can be reduced. Also, this reduces the electric charge which has been avalanche multiplied in pixel end 3 flowing into the pixel array. P type semiconductor region 19 may be formed by implanting N type impurities in P type semiconductor region 14 after P type semiconductor region 14 is formed on the whole substrate to lower the impurity concentration of P type semiconductor region 14. P type semiconductor region 19 may be formed in a region (optical black region) which is not intended for the photodetection among the pixel array. With this, the avalanche multiplication can be reduced in the pixel array that overlaps with P type semiconductor region 19 in planar view, P type semiconductor region 19 can be used as an optical black region also at the time of the avalanche multiplication driving.

In order to reduce the avalanche multiplication in pixel end 3, the impurity concentration of N type semiconductor region 13' in pixel end 3 may be lowered than the impurity concentration of N type semiconductor region 13 in the pixel array. Alternatively, the impurity concentration of N type semiconductor region 18 may be lowered than the impurity concentration of N type semiconductor region 12. In this case, in order to ensure the capability of electrically isolating P+ type semiconductor region 10 from P type well 22 according to the degree of lowering the concentration, it is necessary to increase the overlap width between N type well 16 and N type semiconductor region 13' in planar view, or to make the width (or area in planar view) of N type semiconductor region 18 greater than the width of N type semiconductor region 12.

Note that pixel end isolation region 32a is depleted, and provided with a potential barrier against electrons. Pixel end isolation region 32a is an example of the pixel isolation region for electrically isolating N type semiconductor regions 13 in the pixels in the outermost periphery of the pixel array from N type semiconductor region 13'.

Figure 15:
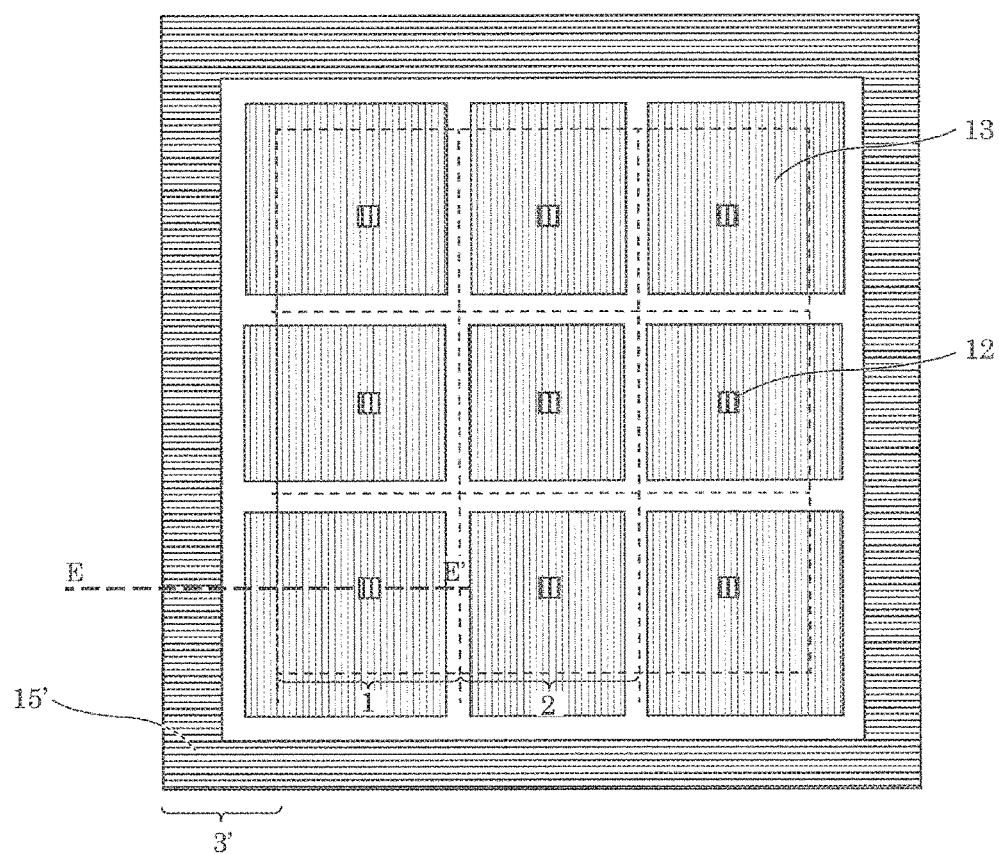
FIG. 15 is a plan view including the pixel end of the solid-state imaging device according to Embodiment 2 of the present disclosure.

FIG. 15 is a diagram illustrating a variation (pixel end 3') of pixel end 3 illustrated in FIG. 13 and FIG. 14. In the present variation, pixel end 3' has a structure in which N type well 15' is disposed to be in contact with first principal surface S1 and surround the pixel array. Moreover, in the periphery of the pixel array, N type semiconductor region 13 is formed to be wider toward the periphery of the pixel array.

Figure 16:
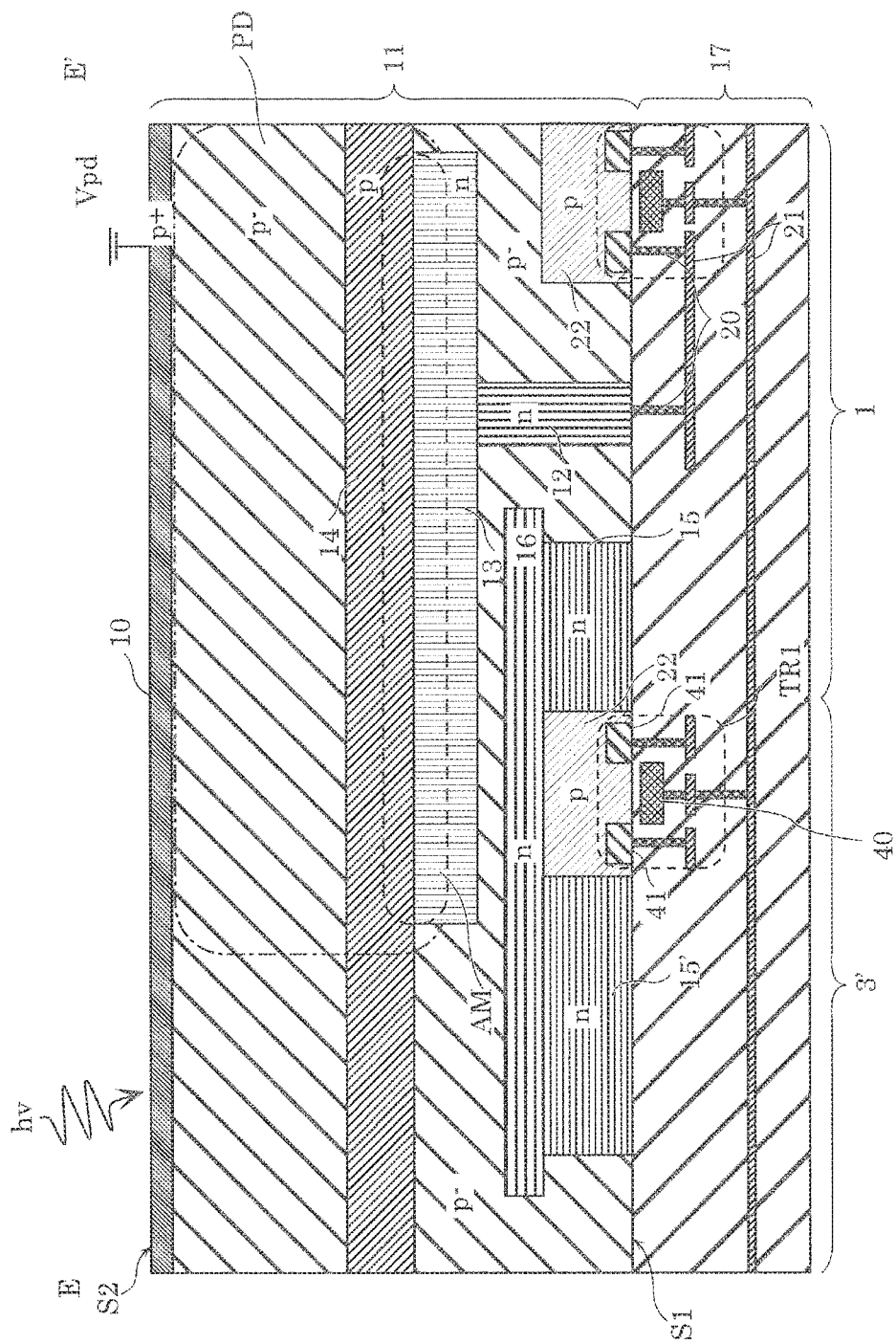
FIG. 16 is a cross-sectional view taken along E-E' line in FIG. 15, including the pixel end of the solid-state imaging device according to Embodiment 2 of the present disclosure.

FIG. 16 is a cross-sectional view taken along E-E' line in FIG. 15. N type well 15' of pixel end 3' is disposed such that to N type well 15' electrically connects to N type well 16. Here, N type semiconductor region 13 is disposed between N type well 16 and P type semiconductor region 14, and N type well 16 is disposed farther away from P type semiconductor region 14 than N type semiconductor region 13. Accordingly, the electric field intensity of pixel end 3' is weaker than inside the pixel array, and the avalanche multiplication in pixel end 3' can be reduced. Moreover, the overlap width between N type semiconductor region 13 and N type well 16 outside the pixel array in planar view is larger than the overlap width inside the pixel array. This enhances the capability of electrically isolating P+ type semiconductor region 10 from P type well 22.

Next, an example of a circuit of a solid-state imaging device using pixel 1 according to any one of Embodiments 1 to 3 described above is described with reference to FIG. 17.

Solid-state imaging device 100 includes pixel array 102, vertical scanning circuit 103, horizontal scanning circuit 104, read-out circuit 105, and buffer amplifier (amplifier circuit) 111. Pixels according to any one of Embodiment 1 to 3 are arranged in a matrix in pixel array 102.

Each pixel 1 includes a circuit including photoelectric conversion layer PD, transfer transistor 106, reset transistor 107, floating diffusion region 108, amplification transistor 109, and selection transistor 110. Transfer transistor 106 corresponds to transistor TR1 according to Embodiments 1 and 2, or transfer transistor TR3 according to Embodiment 3. Amplification transistor 109 corresponds to amplification transistor TR2 according to Embodiment 3. The signal charge detected by photoelectric conversion layer PD is transferred to floating diffusion region 108 through transfer transistor 106. Then, the signals corresponding to the amount of the signal charge detected by the pixels selected sequentially in vertical scanning circuit 103 and horizontal scanning circuit 104 are transmitted to read-out circuit 105 via amplification transistor 109. The signals obtained by each pixel 1 are output to a signal processing circuit (not illustrated) through buffer amplifier 111 from read-out circuit 105. After signal processing such as white balance is performed in a signal processing circuit (not illustrated), the signals are transmitted to a display (not illustrated) or a memory (not illustrated), and imaging can be performed.

As fixed potential Vpd, a voltage can be applied from external power source 101 to solid-state imaging device 100 by switching between voltage Va (for example, −20V) which is the voltage at the time of the avalanche multiplication driving, and voltage Vn (for example, −10V) which is the voltage at the time of the normal driving. By switching the voltages in accordance with the brightness of the object to be captured, the image capturing can be performed under illuminance ranging from the illuminance which is very dark to the illuminance which can be captured with a common camera. Moreover, capturing images by applying voltage by switching between Va and Vn for each frame and combining the images, a video having a wide dynamic range can also be captured.

Figure 17:
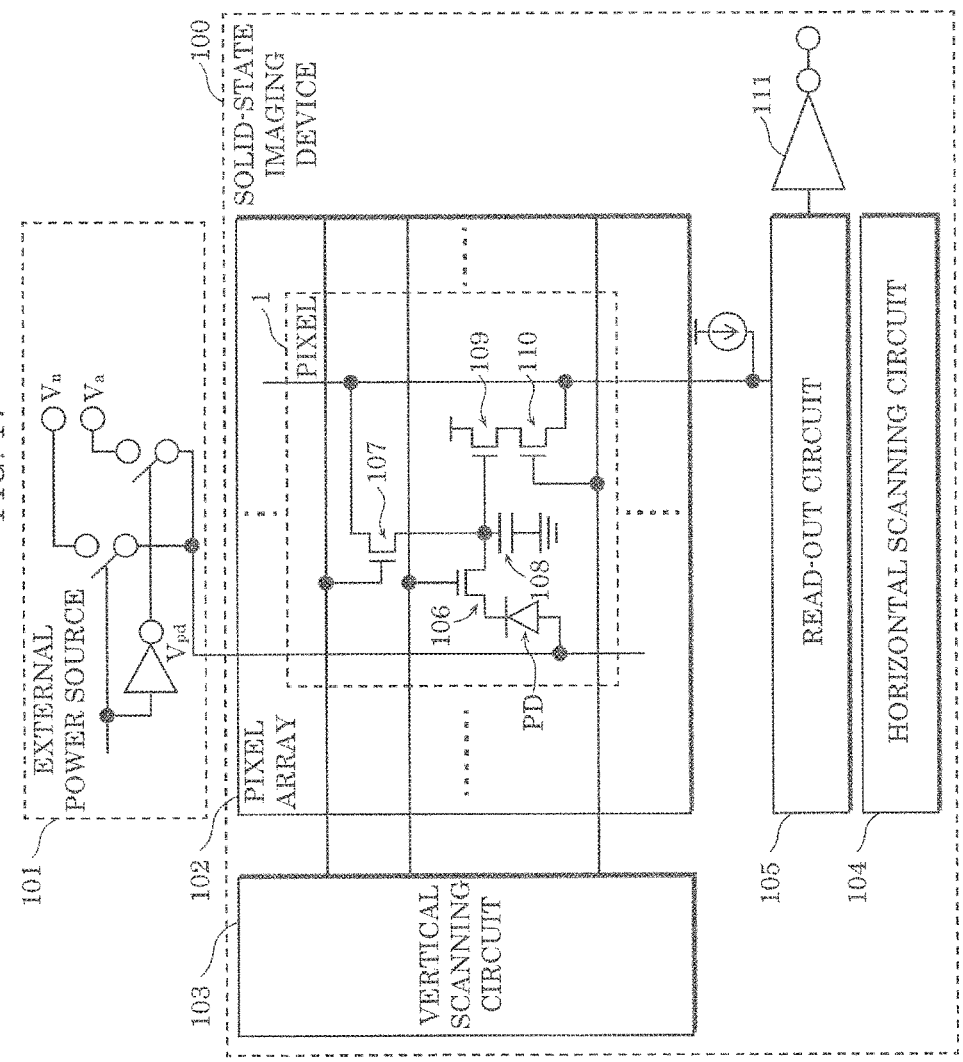
FIG. 17 is an exemplary configuration of the solid-state imaging device according to embodiments of the present disclosure.

Note that in the example of the circuit of the solid-state imaging device illustrated in FIG. 17, peripheral circuits (vertical scanning circuit 103, horizontal scanning circuit 104, read-out circuit 105, and buffer amplifier 111) are added to the pixel array. However, the solid-state imaging device according to the present disclosure does not need to include such peripheral circuits. Moreover, the pixel circuit which is included in pixel 1 includes four transistors (transfer transistor 106, reset transistor 107, amplification transistor 109, selection transistor 110) and one floating diffusion region 108. However, the pixel circuit according to the present disclosure is not limited to such configuration and may include more transistors or less transistors.

As described above, the solid-state imaging device according to the present disclosure includes: a pixel array including a first pixel (pixel 1) and a second pixel (pixel 2) which is adjacent to the first pixel (pixel 1). The pixel array includes: substrate 11 of a first conductivity type (P type), substrate 11 having first principal surface S1 and second principal surface S2 which is on a reverse side of first principal surface S1 and where light enters; and wiring layer 17 disposed on first principal surface S1. Substrate 11 includes, as main structural components, (1) a first semiconductor region (N type semiconductor region 12) of a second conductivity type (N type) which is different from the first conductivity type (P type), the first semiconductor region (N type semiconductor region 12) being provided for each of the first pixel (pixel 1) and the second pixel (pixel 2), disposed inside substrate 11, and extending in a direction from first principal surface S1 toward second principal surface S2; (2) a second semiconductor region (N type semiconductor region 13) of the second conductivity type (N type) provided for each of the first pixel (pixel 1) and the second pixel (pixel 2), the second semiconductor region (N type semiconductor region 13) being disposed inside substrate 11, between second principal surface S2 and the first semiconductor region (N type semiconductor region 12), and connected to the first semiconductor region (N type semiconductor region 12); (3) a third semiconductor region (P type semiconductor region 14) of the first conductivity type (P type), the third semiconductor region (P type semiconductor region 14) being disposed inside substrate 11, between (i) second principal surface S2 and (ii) the second semiconductor region (N type semiconductor region 13) of the first pixel (pixel 1) and the second semiconductor region (N type semiconductor region 13) of the second pixel (pixel 2); (4) a first well region (N type well 15, P type well 22, and P type well 30) disposed inside substrate 11, between the first semiconductor region (N type semiconductor region 12) of the first pixel (pixel 1) and the first semiconductor region (N type semiconductor region 12) of the second pixel (pixel 2), and on first principal surface S1; (5) a pixel circuit (TR1, etc.) disposed in the first well region (N type well 15, P type well 22, and P type well 30); and (6) pixel isolation region 32 disposed inside substrate 11 and between the second semiconductor region (N type semiconductor region 13) of the first pixel (pixel 1) and the second semiconductor region (N type semiconductor region 13) of the second pixel (pixel 2). The second semiconductor region (N type semiconductor region 13) and the third semiconductor region (P type semiconductor region 14) form avalanche multiplication region AM.

With this, avalanche multiplication regions AM and the pixel circuits are embedded in one substrate 11 and the pixel circuits are formed below avalanche multiplication region AM. Thus, the solid-state imaging device which includes the APDs and the pixel circuits in the same substrate is realized while maintaining a high aperture ratio. Moreover, since pixel isolation region 32 is disposed between N type semiconductor region 13 of the first pixel (pixel 1) and N type semiconductor region 13 of the second pixel (pixel 2), crosstalk, in which signal charge generated in a pixel leaks to an adjacent pixel, is reduced. Therefore, a solid-state imaging device in which APDs and pixel circuits are disposed on the same semiconductor substrate while satisfying a high aperture ratio, and which is easily miniaturized and reduces crosstalk.

Moreover, the first well region (P type well 22 or P type well 30) is of the first conductivity type (P type), and is electrically isolated from the third semiconductor region (P type semiconductor region 14) by pixel isolation region 32.

With this, since the first well region (P type well 22 or P type well 30) is of the first conductivity type (P type), an N channel transistor can be formed in the first well region.

Moreover, a second well region (N type well 16) of the second conductivity type (N type) is further included. The second well region (N type well 16) is disposed between the first well region (P type well 22 or P type well 30) and the second semiconductor region (N type semiconductor region 13), and electrically isolated from the second semiconductor region (N type semiconductor region 13).

With this, the P type semiconductor regions between the second semiconductor region (N type semiconductor region 13) and the second well region (N type well 16) and between first semiconductor region (N type semiconductor region 12) and the second well region (N type well 16) are depleted. Accordingly, the potential barrier against electrons is formed between the first well region (P type well 22 or P type well 30) and P+ type semiconductor region 10, and the first well region (P type well 22 or P type well 30) can be electrically isolated from fixed potential Vpd.

Moreover, a potential barrier against electrons in pixel isolation region 32 is higher than a potential barrier against electrons in a region of the first conductivity type (P type) between the first semiconductor region (N type semiconductor region 12) and the second well region (N type well 16).

With this, in the case of capturing a high luminance object or in the case of capturing with a multiplication factor exceeding the number of saturation electrons, etc., the electric charge excessively accumulated in the first semiconductor region (N type semiconductor region 12) of pixel 1 is discharged to second well region (N type well 16). Accordingly, the generation of blooming due to such electric charge flowing into the first semiconductor region (N type semiconductor region 12) of pixel 2 which is adjacent through the second semiconductor region (N type semiconductor region 13) is reduced.

Moreover, a surface inactive region (P+ type semiconductor region 33) of the second conductivity type (N type) is further included. The surface inactive region is disposed between the first semiconductor region (N type semiconductor region 12) and first principal surface S1. The pixel circuit has a metal-oxide-semiconductor (MOS) transistor (TR3) whose source region is the first semiconductor region (N type semiconductor region 12).

With this, N type semiconductor region 12 used as the source region will be embedded to the region away (deep) from first principal surface S1 with more crystal defects than substrate 11 inside, the normal driving which the leakage current resulting from the many crystal defects which exist in a substrate surface (first principal surface S1) is reduced. Consequently, the image quality improves even in the normal driving which does not perform avalanche multiplication and a large dynamic range is ensured.

Moreover, pixel isolation region 32 is of the first conductivity type (P type) or the second conductivity type (N type)

in which an impurity concentration is lower than an impurity concentration of the second semiconductor region (N type semiconductor region 13).

With this, a potential barrier against electrons is provided in pixel isolation region 32. Accordingly, image capturing can be performed under a voltage condition which does not cause a breakdown (normal driving). Color mixture of the captured image is reduced by the pixel isolation region even with a brightness of daylight. Therefore, when a scene is captured in which a dark area and a bright area coexist, a clear image having a wide dynamic range can be obtained by using, for example, image processing in which an image is captured by driving with the avalanche multiplication, and then another image is captured by a usual normal-driving which does not perform multiplication, and combing both images.

Moreover, in the first semiconductor region (N type semiconductor region 12), a cross-sectional area of a plane parallel to first principal surface S1 on a second principal surface S2 side is larger than a cross-sectional area of a plane parallel to first principal surface S1 on first principal surface S1 side.

With this, the electrons generated by the photoelectric conversion in photoelectric conversion layer PD easily drift toward first semiconductor region (N type semiconductor region 12), and the sensitivity of the solid-state imaging device can be improved.

Moreover, an impurity concentration (p−) of a region between the third semiconductor region (P type semiconductor region 14) and second principal surface S2 is lower than an impurity concentration (p) of the third semiconductor region (P type semiconductor region 14).

This reduces the probability that the electrons generated in photoelectric conversion layer PD recombine, and increases the probability that the electrons reach first semiconductor region (N type semiconductor region 12). Thus, the probability of photoelectrical conversion of light that has entered from second principal surface S2 increases.

Moreover, a fourth semiconductor region (N type semiconductor region 18) of the second conductivity type (N type) is further included. The fourth semiconductor region (N type semiconductor region 18) is disposed inside substrate 11, surrounding the pixel array, and contacting first principal surface S1. A gradient of an impurity concentration in a PN junction formed by the fourth semiconductor region (N type semiconductor region 18) and a region contacting the fourth semiconductor region (N type semiconductor region 18) in substrate 11 is smaller than a gradient of an impurity concentration in a PN junction formed by the second semiconductor region (N type semiconductor region 13) and the third semiconductor region (P type semiconductor region 14).

With this, application of a fixed voltage to the fourth semiconductor region (N type semiconductor region 18) reduces the leakage current flowing into the pixel array. The leakage current occurs outside the pixel array on first principal surface S1 due to a surface defect. Furthermore, the electric field intensity between the fourth semiconductor region (N type semiconductor region 18) and the third semiconductor region (P type semiconductor region 14) is lower than the electric field intensity inside the pixel array. Accordingly, this reduces the occurrence of the avalanche multiplication between the fourth semiconductor region (N type semiconductor region 18) and the third semiconductor region (P type semiconductor region 14), and thus reduces unnecessary power consumption in pixel end 3.

Moreover, a fifth semiconductor region electrically (N type semiconductor region 13') connected to the fourth semiconductor region (N type semiconductor region 18); and pixel end isolation region 32a for electrically isolating the second semiconductor region (N type semiconductor region 13) in a pixel (pixel 1) in an outermost periphery of the pixel array from the fifth semiconductor region (N type semiconductor region 13') are further included. Pixel end isolation region 32a is depleted.

With this, since the potential barrier against electrons is formed in pixel end isolation region 32a, the avalanche multiplication in pixel end 3 and unnecessary power consumption are reduced. The shortcoming that the electric charge which has been avalanche multiplied in pixel end 3 flows into the pixel array is also reduced.

Other Embodiments

Although the solid-state imaging device according to the embodiments and variation of the present disclosure has been described above, the present disclosure is not limited to the above embodiments and variation.

Moreover, the numerals used above are all provided as examples for specifically describing the present disclosure, and the present disclosure is not limited to these numerals.

Furthermore, the above-noted materials of the individual structural components are all provided as examples for specifically describing the present disclosure, and the present disclosure is not limited to these materials. Moreover, the connection relationship between the structural components is provided as an example for specifically describing the present disclosure, and the connection relationship for implementing the functions of the present disclosure is not limited to this.

Furthermore, the present disclosure also includes many variations of the embodiment and variation described above within the range conceivable by a person skilled in the art without departing from the purport of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure is applicable to a high sensitivity solid-state imaging apparatus, etc.

What is claimed is:
1. A solid-state imaging device comprising:
a pixel array including a first pixel and a second pixel which is adjacent to the first pixel,
wherein the pixel array includes:
a substrate of a first conductivity type, the substrate having a first principal surface and a second principal surface which is on a reverse side of the first principal surface and where light enters; and
a wiring layer disposed on the first principal surface, the substrate includes:
a first semiconductor region of a second conductivity type which is different from the first conductivity type, the first semiconductor region being provided for each of the first pixel and the second pixel, disposed inside the substrate, and extending in a direction from the first principal surface toward the second principal surface;

a second semiconductor region of the second conductivity type provided for each of the first pixel and the second pixel, the second semiconductor region being disposed inside the substrate, between the second principal surface and the first semiconductor region, and connected to the first semiconductor region;

a third semiconductor region of the first conductivity type, the third semiconductor region being disposed inside the substrate, between (i) the second principal surface and (ii) the second semiconductor region of the first pixel and the second semiconductor region of the second pixel;

a first well region disposed inside the substrate, between the first semiconductor region of the first pixel and the first semiconductor region of the second pixel, and on the first principal surface;

a pixel circuit disposed in the first well region; and a pixel isolation region disposed inside the substrate, between the second semiconductor region of the first pixel and the second semiconductor region of the second pixel, and the second semiconductor region and the third semiconductor region form an avalanche multiplication region.

2. The solid-state imaging device according to claim 1, wherein the first well region is of the first conductivity type, and is electrically isolated from the third semiconductor region by the pixel isolation region.

3. The solid-state imaging device according to claim 2, further comprising:

a second well region of the second conductivity type, the second well region being disposed between the first well region and the second semiconductor region, and electrically isolated from the second semiconductor region.

4. The solid-state imaging device according to claim 3, wherein a potential barrier against electrons in the pixel isolation region is higher than a potential barrier against electrons in a region of the first conductivity type between the first semiconductor region and the second well region.

5. The solid-state imaging device according to claim 2, further comprising:

a surface inactive region of the second conductivity type, the surface inactive region being disposed between the first semiconductor region and the first principal surface, wherein the pixel circuit has a metal-oxide-semiconductor (MOS) transistor whose source region is the first semiconductor region.

6. The solid-state imaging device according to claim 1, wherein the pixel isolation region is of the first conductivity type or the second conductivity type in which an impurity concentration is lower than an impurity concentration of the second semiconductor region.

7. The solid-state imaging device according to claim 1, wherein in the first semiconductor region, a cross-sectional area of a plane parallel to the first principal surface on a second principal surface side is larger than a cross-sectional area of a plane parallel to the first principal surface on a first principal surface side.

8. The solid-state imaging device according to claim 1, wherein an impurity concentration of a region between the third semiconductor region and the second principal surface is lower than an impurity concentration of the third semiconductor region.

9. The solid-state imaging device according to claim 1, further comprising:

a fourth semiconductor region of the second conductivity type, the fourth semiconductor region being disposed inside the substrate, surrounding the pixel array, and contacting the first principal surface, wherein a gradient of an impurity concentration in a PN junction formed by the fourth semiconductor region and a region contacting the fourth semiconductor region in the substrate is smaller than a gradient of an impurity concentration in a PN junction formed by the second semiconductor region and the third semiconductor region.

10. The solid-state imaging device according to claim 9, further comprising:

a fifth semiconductor region electrically connected to the fourth semiconductor region; and a pixel end isolation region for electrically isolating the second semiconductor region in a pixel in an outermost periphery of the pixel array from the fifth semiconductor region, wherein the pixel end isolation region is depleted.

* * * * *